(12) United States Patent
Udagawa

(10) Patent No.: US 6,541,797 B1
(45) Date of Patent: Apr. 1, 2003

(54) GROUP-III NITRIDE SEMICONDUCTOR LIGHT-EMITTING DEVICE

(75) Inventor: Takashi Udagawa, Chichibu (JP)

(73) Assignee: Showa Denko K. K., Tokyo (JP)

( * ) Notice: Subject to any disclaimer, the term of this patent is extended or adjusted under 35 U.S.C. 154(b) by 0 days.

(21) Appl. No.: 09/204,280

(22) Filed: Dec. 3, 1998

(30) Foreign Application Priority Data

Dec. 4, 1997 (JP) ............................................. 9-334540
Apr. 10, 1998 (JP) ........................................... 10-098661

(51) Int. Cl.$^7$ ............................................. H01L 33/00
(52) U.S. Cl. ............................. 257/94; 257/96; 257/97; 257/101
(58) Field of Search ............................. 257/94, 96, 97, 257/101

(56) References Cited

U.S. PATENT DOCUMENTS

| 5,578,839 | A | * | 11/1996 | Nakamura et al. | ............ 257/96 |
| 5,777,350 | A | * | 7/1998 | Nakamura et al. | ............ 257/96 |
| 5,886,367 | A | * | 3/1999 | Udagawa | ..................... 257/64 |
| 5,959,307 | A | * | 9/1999 | Nakamura et al. | ............ 257/14 |

FOREIGN PATENT DOCUMENTS

| GB | 2 310 083 A | | 8/1997 | | |
| JP | 55-3834 | | 1/1980 | | |
| JP | 58-071670 A | * | 4/1983 | ........... | H01L/33/00 |
| JP | 8-293643 | | 11/1996 | | |
| JP | 9-36430 | | 2/1997 | | |
| JP | 11-354842 A | * | 12/1999 | ........... | H01L/33/00 |

OTHER PUBLICATIONS

Journal of Crystal Growth 107 (1991) pp. 360–364.
Materials Research Society Symposium Proceedings vol. 395 (Nov. 27–Dec. 1, 1995). Boston, Massachusetts.
Solid State Communications, vol. 11, pp. 617–621, 1972.
Journal of Applied Physics, vol. 46, No. 8, Aug. 1975.
Appl. Phys. Lett. 69(25), Dec. 16, 1996.
Appl. Phys. Lett. 69(6), Aug. 5, 1996.
Appl. Phys. Lett. 69(23), Dec. 2, 1996.
IEEE Electron Device Letters, vol. EDL–7, No. 2, Feb. 1986.
IEEE Electron Device Letters, vol. EDL–7, No. 7, Jul. 1986.
M.A. Herman H. Sitter, Molecular Beam Expitaxy, Springer.
The Japan Society of Applied Physics and Related Societes, No. 1, 1997.
Physics of Semiconductor Superlattice and its Application pp. 226–229.
Physics of Semiconductor Superlattice and its Application, pp. 138–145.
Physics of Semiconductor Superlattice and its Application, pp. 42–47.
Physics of Semiconductor, vol. 2, (the 4th edition), pp. 352–361.
Semiconductor Engineering—from basic to device, Tokyo Denki Univ.pp. 72–73.

(List continued on next page.)

*Primary Examiner*—Wael Fahmy
*Assistant Examiner*—Wai-Sing Louie
(74) *Attorney, Agent, or Firm*—Armstrong, Westerman & Hattori, LLP

(57) ABSTRACT

A group-III nitride semiconductor light-emitting device includes an n-type light-emitting layer formed of an indium-containing group-III nitride semiconductor and disposed between a group-III nitride semiconductor n-type layer and a group-III nitride semiconductor p-type layer. A thin layer of a group-III nitride semiconductor 3 nm to 30 nm thick that has a carrier concentration of up to $5 \times 10^{17} \text{cm}^{-3}$ is provided between the n-type light-emitting layer and the p-type semiconductor layer. The n-type light-emitting layer has a donor concentration of $5 \times 10^{17} \text{cm}^{-3}$ to $1 \times 10^{19} \text{cm}^{-3}$. An electron localized region is provided in a region of the n-type light-emitting layer in the vicinity of a junction interface with the thin layer in which are selectively accumulated and localized electrons having a sheet carrier concentration of $1 \times 10^{11} \text{cm}^{-2}$ to $5 \times 10^{13} \text{cm}^{-2}$.

5 Claims, 14 Drawing Sheets

OTHER PUBLICATIONS

Kozo Osamura et al., Preparation and optical properties of $Ga_{1-x}In_xN$ thin films, Journal of Applied Physics, vol. 46, No. 8, Aug. 1975, pp. 3432–3437.

Q. Chen et al.., High transconductance heterostructure field-effect transistors bsaed on AlGaN/GaN, Appl. Phys. Lett. 69 (6), Aug. 5, 1996, pp. 794–796.

Ozgur Aktas et al., High temperature characteristics of AlGaN/GaN modulation doped field–effect transistors, Appl. Phys. Lett. 69 (25), Dec. 16, 1996, pp. 3872–3874.

J. P. Bergman et al., Photoluminescence related to the two–dimensional electron gas at a GaN/AlGaN heterointerface, Appl. Phys. Lett. 69 (23), Dec. 2, 1996, pp. 3456–3458.

Shuji Nakamura et al., InGaN–Based Multi–Quantum–Well–Structure Laser Diodes, Jpn. J. Appl. Phys. vol. 35 (1996) pp. L74–L76, Part 2, No. 1B, Jan. 15, 1996.

Shuji Nakamura et al., High–Brightness InGaN Blue, Green and Yellow Light–Emitting Diodes with Quantum Well Structures, Jpn. J. Appl. Phys. vol. 34 (1995) pp. L797–L799, Part 2, No. 7A, Jul. 1, 1995.

Shuji Nakamura et al., High–brightness InGaN/AlGaN double–heterostructure blue–green–light–emitting diodes, J. Appl. Phys. 76 (12), Dec. 15, 1995, American Institute of Physics.

Shuji Nakamura et al., Candela–class high–brightness InGaN/AlGaN double–heterostructure blue–light–emitting diodes, Appl. Phys. Lett. 64 (13), Mar. 28, 1994, American Institute of Physics.

* cited by examiner

GROUP-III NITRIDE SEMICONDUCTOR LIGHT-EMITTING DEVICE

BACKGROUND OF THE INVENTION

1. Field of the Invention

This invention relates to a group-III nitride semiconductor light-emitting device comprising an n-type semiconducting layer and a p-type semiconducting layer formed of a group-III nitride semiconductor, between which is disposed an n-type light-emitting layer formed of a group-III nitride semiconductor containing indium.

2. Description of the Prior Art

In recent years, light-emitting diodes (LEDs) and laser diodes (LDs) that use a light-emitting layer formed of a group-III nitride semiconductor are being commercialized as light-emitting devices. As the group-III nitride semiconductor used to constitute the light-emitting layer, there is mainly used gallium indium nitride of composition formula: $Ga_xIn_{1-x}N$ ($0 \leq x \leq 1$) in which the composition ratio of indium is adjusted to obtain the emission of the desired short wavelength visible light (see JP-B 55-3834).

The light-emitting section having a gallium indium nitride light-emitting layer can be broadly divided into three types, in terms of structure. The first type is a single heterojunction (SH) structure comprised of an n-type light-emitting layer and a p-type cladding layer; the second is a double heterojunction (DH) structure in which an n-type light-emitting layer is sandwiched between p-type and n-type barrier layers (cladding layers); and the third is a quantum well (QW) junction structure in which a well layer is n-type $Ga_xIn_{1-x}N$.

In such structures, the basic mechanism by which light is emitted is radiation recombination of carriers, the carriers that are recombined being electrons and holes. This radiation recombination of carriers generates the radiation of light having a wavelength that corresponds to the difference $\Delta E$ between the energy levels of the carrier electrons and holes. The relationship between the wavelength $\lambda$ (nm) of the light radiated by electron transition and the energy level difference $\Delta E$ (eV) can be approximated by equation (1).

$$\lambda = 1.24 \times 10^3 / \Delta E \quad (1)$$

A brief explanation will now be given of the mechanism by which radiation recombination gives rise to light emission. This mechanism is common to the three structures of the light-emitting section described above. Here, the explanation will be given with respect to the third type of structure, the quantum well.

FIG. 17 is a depiction of the ideal band arrangement of a quantum well structure. Depicted is a single quantum well (SQW) structure or one structural unit of a multi quantum well (MQW) structure.

In the figure, a potential well W1 and W2 is formed on the conduction band side and valence band side, respectively, of a well layer W. A potential barrier is formed at each side of the quantum well layer W by a band offset (discontinuity) with each barrier layer B in contact with the quantum well layer W. This band discontinuity arises from the bandgap difference of the nitride semiconductors that constitute the emission and barrier layers.

In the quantum well structure, quantized levels (quantum levels) L11 and L12, and L21 and L22 are formed within the potential well W1 and W2, as denoted in the drawings by the broken lines. The radiation recombination that takes place is produced by the transition of carriers between these quantum levels. That is, transitions are generated between electrons and light holes or between electrons and heavy holes, adhering to the wavelength selection rule in the k-space, whereby light is radiated having a wavelength that corresponds to the quantum level differential therebetween. In the case of FIG. 17, for example, transitions arise between electron quantum level L11 and hole quantum level L21, and in accordance with equation (1), this results in the radiation of light having a wavelength that corresponds to the energy level differential therebetween.

Also, the quantum levels L11, L12, L21 and L22 are distributed uniformly in the width direction (horizontal direction) of the quantum well layer W, into a rectangular distribution, while retaining a fixed potential differential from the conductance band.

In the light-emitting layer formed from the quantum well layer W in which the quantum levels L11, L12, L21 and L22 have a rectangular distribution, it is necessary to suppress variation in the wavelength of the emitted light in order to obtain full monochromaticity. To do this, it is necessary to have an abrupt change between the quantum well layer and barrier layer bands, and to be able to stably reproduce this abrupt band change. For this, it is important to achieve abrupt compositional changes with respect to the constituent elements in the junction interface between the quantum well layer and the barrier layer.

However, effecting this abrupt compositional change in the junction interface requires the use of a high level of interfacial control technology. In practice, the band change between the quantum well and barrier layers is gradual, as shown in FIG. 18.

With respect to FIG. 18 which shows a comparison between an actual band structure D1 and an ideal band structure D2, indicated by the broken line, when the band offset is gradual, quantum level L3 in the quantum well layer W decreases to L31 and quantum level L4 decreases to L41. This is the phenomenon that is generally recognized as quantum level fluctuation (see page 227 of fourth printing of first edition "Physics and Applications of Semiconductor Superlattices," edited by the Physical Society of Japan and first published on Sep. 30, 1986, by K. K. Baifukan, a Japanese corporation).

This quantum level fluctuation is also caused by slight changes in the thickness of the quantum well layer. With respect to FIG. 19, for example, if the thickness (width) of the quantum well layer W, as indicated by the solid line, is reduced to the thickness indicated by the broken line, quantum level L5 is elevated to L51. If the thickness is increased, as indicated by the dot-dash line, L5 decreases to L52. It is extremely difficult to control the thickness of the quantum well layer to a precise enough degree that ensures that there is no change in the quantum level.

Quantum level fluctuation has been held to cause instability of energy level differentials and variations in the wavelength of light emissions. Light-emitting devices having a quantum well structure with a conventional light-emitting layer of gallium indium nitride are prone to the effects of gradual compositional changes in the junction interface and slight changes in the thickness (width) of the quantum well layer W, changing emission wavelengths and therefore making it difficult to stably utilize the monochromatic properties.

In addition to the fact that light-emitting devices with a gallium indium nitride light-emitting layer are susceptible to fluctuations in quantum level, a further problem is that in such devices, it is difficult to form a good-quality junction interface.

This is because the qualities of the gallium indium nitride are readily altered by heating, producing a multiplicity of phases with varying indium concentrations (compositions), meaning there is a strong tendency to form a multi-phase structure (see (1) Solid State Commun., 11 (1972), pp 617 to 621; (2) J. Appl. Phys., 46 (8) (1975), pp 3432 to 3437).

FIG. 20 is a drawing showing the known structure of a light-emitting section that includes a light-emitting layer formed of gallium indium nitride. In the drawing, barrier layers B10 adjoining a well layer W10 are comprised of a binary (two-element) compound, gallium nitride (GaN), that enables phase changes to be ignored. The qualities of the gallium indium nitride mixed-crystal forming the light-emitting layer (well layer) W10 are readily altered by heat, producing a separation between the internal matrix phase P10 and the crystallite subsidiary phase P11. The matrix phase P10 and subsidiary phase P11 have different indium concentrations, and a correspondingly different bandgap. Variation also arises in the band offset based on the type of phase that is present in the junction interfaces between the light-emitting layer W10 and the barrier layers B10. Variations in the band offset will cause changes in the quantum level in the well layer W10. That is, in the case of a light-emitting section that includes a light-emitting layer formed of gallium indium nitride, in addition to fluctuations in quantum levels caused by the difficulty of controlling the composition at the junction interface and the layer thickness, quantized level fluctuation is also caused by the multi-phase tendency of the gallium indium nitride, which also results in a loss of monochromaticity.

Also with reference to FIG. 20, the light-emitting section comprised of gallium nitride/gallium indium nitride/gallium nitride is formed by forming the gallium nitride of the lower layer at 1100° C., then lowering the formation temperature to a temperature range of from about 800° C. to about 900° C., forming the intermediate gallium indium nitride layer, then raising the temperature back up to over 1000° C., to a temperature suitable for the formation of the gallium nitride upper layer. The heat produced when the temperature is increased to the temperature used to form the gallium nitride upper layer can cause sublimation of the gallium indium nitride intermediate layer, resulting in localized loss of the light-emitting layer. This localized loss of the light-emitting layer caused by sublimation and the like can change the thickness (well width) of parts of the light-emitting layer.

Thus, along with its multi-phase tendency, gallium indium nitride light-emitting layers are also susceptible to changes in the thickness (width) of the well layer arising in the course of the layer formation processes. These changes in layer thickness give rise to quantized level fluctuation, resulting in non- uniformity in the wavelength of the emitted light. The result is a loss of monochromaticity and a weakening of the intensity of the emitted light.

Thus, owing to the fact that (1) the difficulty of forming abrupt compositional ratios at the junction interfaces of the light-emitting section results in gradual band changes, (2) the wavelength of the emitted light is highly susceptible to slight changes in the thickness of the light-emitting layer, (3) the light-emitting layer tends to readily assume a multi-phase structure (non-miscibility), and (4) the light-emitting layer is prone to sublimation, while a light-emitting device in which the light-emitting layer is formed of gallium indium nitride might function, it will be subject to instability of the emitted light wavelength, loss of monochromaticity, and a relatively low emission intensity.

These problems produced a demand for a light-emitting arrangement capable of stably providing excellent carrier-recombination-induced (transitions between quantum levels) light emission properties. The present inventor therefore focused on a device in which carrier recombination is effected using a non-rectangular, rather than a rectangular, potential well arrangement.

A two-dimensional electron gas field effect transistor (TEGFET) is an example of a device in which carrier recombination takes place in a non-rectangular potential well structure. One type of TEGFET is the high mobility field effect transistor (modulation doped field effect transistor (MODFET)) formed of group-III–V compound semiconductor.

FIG. 21 shows the band structure of a MODFET. As shown, the MODFET band structure is non-rectangular in shape, and is comprised of an electron channeling layer (a channel layer) S1, a spacer layer S2 and an electron supplying layer S3. Conduction band and valence band discontinuities 501 and 502 are formed in a region inside the channel layer S1 in the vicinity of the junction interface 510 between the channel layer S1 and the spacer layer S2. There is a pronounced drop at the bend 503 in the conduction band, the conduction band level in the region in the vicinity of the junction interface 510 falling below the Fermi level F. Since this part of the conduction band that is below the Fermi level F has a low potential, electrons e accumulate and are localized there.

A comparison of electron (carrier) distribution states shows that quantized electrons in the conventional rectangular potential well layer are not localized at the junction interface with the barrier layer, but are instead substantially evenly distributed in the well layer at a level that keeps energy differential relative to the conduction band substantially constant. In contrast, electrons in the non-rectangular band structure of the MODFET accumulate and are localized in a region in the vicinity of the junction interface with other layers, that is, in a specific region of the channel layer S1 that constitutes the active layer.

In the MODFET, the electrons e are accumulated in the non-rectangular potential well formed at the bend of the conduction band structure, where they are confined two-dimensionally so as not to behave three-dimensionally to thereby utilize them as carriers for high-speed device operation.

There are GaAs/AlGaAs system MODFETs, GaInAs/AlGaAs system MODFETs. Recently, there are also gallium nitride system MODFETs (see, for example, Appl. Phys. Lett., 69 (25) (1996), pp 3872 to 3874). These gallium nitride MODFETs are formed of gallium nitride and aluminum gallium nitride mixed-crystal, with the gallium nitride being used to form the channel layer S1 and the aluminum gallium nitride mixed-crystal being used to form the spacer layer S2 and electron supplying layer S3 (see Appl. Phys. Lett., 69 (6) (1996), pp 794 to 796). It has already been reported that changes in band structure are produced that give rise to electron localization in a region in the vicinity of the junction interface between the gallium nitride and the aluminum gallium nitride mixed-crystal (Appl. Phys. Lett., 69 (23) (1996), pp 3456 to 3458).

Looking at the junction arrangement of the MODFET, the changes in band structure producing carrier (electron) localization are made at the junction interface between n-type conduction bands: that is, in the nn junction portions between n-type channel layer and n-type spacer layer or electron supplying layer. Looking at the order in which the crystal layers are formed, from the substrate crystal side, there is also what is generally referred to as an inverse-structure MODFET (see IEEE Electron Device Lett., EDL- 7(1986), pp 71 and 454). In that case, the accumulation of carriers (electrons) as a two-dimensional electron gas is in the nn junction portions between n-type channel layer and n-type electron supplying layer or spacer layer. Thus, in each case MODFET carrier localization utilizes nn junction portions.

Concerning group-III nitride semiconductor devices that use a light-emitting layer of gallium indium nitride mixed-crystal, there are reports the contents of which suggest the feasibility of light emission via quanta in a confinement state in the light-emitting layer (see 28a-D-6 on page 178 of the Extended Abstructs No. 1, the 44th Meeting, The Japan Society of Applied Physics and Related Societies, 1997). However, the actual carrier confinement state is unclear, so the contribution that the carriers having what type of distribution in what type of band structure make to recombination giving rise to light emission is unknown.

Thus, as described above, a conventional light-emitting section with a gallium indium nitride light-emitting layer has a rectangular potential well structure and has problems that include a gradualized band change, susceptibility to the effect of differences in the thickness of the light-emitting layer, multi-phasing (non-miscibility) of the light-emitting layer and ready sublimation. Owing to these problems, light emitted by the light-emitting section is subject to variations in wavelength, loss of monochromaticity and loss of intensity.

On the other hand, while it has been found to be feasible to use a non-rectangular potential well structure to enable carrier recombination to be used to stably realize excellent light emission properties, the fact is that, in the field of light-emitting devices, the non-rectangular potential well structure has not been elucidated, and as such, neither the carrier distribution in such a structure, nor the component elements that contribute to the improvement of the light emission properties, are clearly known, and therefore it has not reached the stage where the light monochromaticity and emission intensity can be improved.

An object of the present invention is to provide a group-III nitride semiconductor light-emitting device capable of the high-intensity emission of short wavelength light having excellent monochromaticity from blue to green emission regions, by clarifying the optimum arrangement for applying a non-rectangular potential well structure to a light-emitting layer and effecting a major improvement in the light monochromaticity and emission intensity characteristics.

SUMMARY OF THE INVENTION

To attain the above object, the present invention provides a group-III nitride semiconductor light-emitting device comprising an n-type semiconductor layer formed of a group-III nitride semiconductor, a p-type semiconductor layer formed of a group-III nitride semiconductor, and an n-type light-emitting layer formed of an indium-containing group-III nitride semiconductor and disposed between the n-type semiconductor layer and the p-type semiconductor layer, wherein a thin layer of a group-III nitride semiconductor having a thickness of from not less than 3 nm to not more than 30 nm and a carrier concentration of not more than $5 \times 10^{17} \text{cm}^{-3}$ is disposed between the n-type light-emitting layer and the p-type semiconductor layer, the n-type light-emitting layer has a donor concentration of from not less than $5 \times 10^{17} \text{cm}^{-3}$ to not more than $1 \times 10^{19} \text{cm}^{-3}$, and an electron localized region is provided in a region of the n-type light-emitting layer in a vicinity of a junction interface with the thin layer in which are selectively accumulated and localized electrons having a sheet carrier concentration of from not less than $1 \times 10^{11} \text{cm}^{-2}$ to not more than $5 \times 10^{13} \text{cm}^{-2}$.

In this invention, as described above, an electron localized region is provided in a part of the n-type light-emitting layer that is in the vicinity of the junction interface with the thin layer, so that when, under a forward bias, holes of the p-type semiconductor layer diffuse via the thin layer into the light-emitting layer side of the junction interface, the holes flow down into the adjoining electron localized region and recombine with electrons in the electron localized region. Recombination therefore takes place smoothly and a high light-emission intensity can be obtained. The smoothness of the recombination also enhances high-speed emission on/off response characteristics. Also, the provision between the n-type light-emitting layer and the p-type semiconductor layer of a thin layer having a carrier concentration not exceeding $5 \times 10^{17} \text{cm}^{-3}$ and the provision of the electron localized region adjacent to the thin layer enables the conduction band offset on the thin layer side of the n-type light-emitting layer to be increased, thereby making it possible to deepen the conduction band bend at the electron localized region in the n-type light-emitting layer. Thus, electrons can be confined more securely in the electron localized region for more efficient recombination, resulting in better light emission characteristics.

Moreover, by giving the n-type light-emitting layer a donor concentration of from not less than $5 \times 10^{17} \text{cm}^{-3}$ to not more than $1 \times 10^{19} \text{cm}^{-3}$, the number of electrons that normally exhibit three-dimensional behavior in the three-dimensional space of the n-type light-emitting layer (three-dimensional carriers) is limited, making it possible to maintain the number of electrons that flow into the electron localized region at an appropriate level.

Also, by ensuring that in the electron localized region the sheet carrier concentration of electrons exhibiting mainly two-dimensional behavior (two-dimensional carriers) is not less than $1 \times 10^{11} \text{cm}^{-2}$ and not more than $5 \times 10^{13} \text{cm}^{-2}$, the proportion of the electron localized region taken up by two-dimensional carriers can be optimized with respect to the three-dimensional carriers in the three-dimensional space of the light-emitting layer.

Since the donor concentration of the n-type light-emitting layer and the sheet carrier concentration of the region of the n-type light-emitting layer in the vicinity of the junction interface with the thin layer are thus prescribed, the quantity of electrons in the electron localized region can be maintained at an appropriate level, thereby optimizing the light emission characteristics.

The device of the invention also includes one having a configuration in which the region of the n-type light-emitting layer in the vicinity of the junction interface with the thin layer is provided with a low carrier concentration layer having a carrier concentration that is lower than the carrier concentration in the region of the n-type light-emitting layer in the vicinity of the junction interface with the n-type semiconductor layer, and in which the low carrier concentration layer is provided with an electron localized region.

With the provision of a low carrier concentration layer in the region of the n-type light-emitting layer in the vicinity of the junction interface with the thin layer, and the provision of the low carrier concentration layer with an electron localized region, electrons from the surrounding light-emitting layer having a high carrier concentration can flow more easily into the electron localized region. Also, the electron localized region has a low concentration of impurities, meaning it is a region of high purity, so obstacles to the channeling of electrons caused by impurities do not readily arise, allowing high-speed, two-dimensional channeling of electrons to proceed smoothly.

The device of the present invention also includes one having a configuration in which the carrier concentration of the low carrier concentration layer is not more than $5 \times 10^{17} \text{cm}^{-3}$ and the layer thickness is from not less than 2 nm to not more than 20 nm. As a result, the movement of electrons that have accumulated in the electron localized region is restricted to a two-dimensional plane, controlling three-dimensional behavior and eliminating the wasted consumption of energy. Thus, since the electrons can actively move in the two-dimensional plane, recombination of electrons and holes can take place at higher speed, and it is possible to prevent reductions in the quantities of electrons accumulating in the electron localized region, and increases in the forward current.

The device of the invention also includes one having a configuration in which the n-type light-emitting layer is formed as a multi-phase structure comprised of matrix and subsidiary phases having different indium concentrations, and an n-type intermediate layer in which the conduction band discontinuity with respect to the matrix phase in the junction interface with the n-type light-emitting layer is not more than 0.2 eV is interposed between the n-type semiconductor layer and the n-type light-emitting layer.

By interposing an n-type intermediate layer between the n-type semiconductor layer and the n-type light-emitting layer in which the band offset on the conduction band side of the junction interface with the light-emitting layer is not more than 0.2 eV, the band offset between the intermediate layer and the light-emitting layer is decreased to the extent that the junction can be regarded as substantially a homojunction. Thus, this junction configuration serves to inhibit carriers (electrons) supplied from the n-type semiconductor layer side from staying in the junction interface on the n-type layer side of the light-emitting layer, thereby smoothly guiding the carriers into the light-emitting layer, and also has the effect of selectively and efficiently causing the carriers to be accumulated in the electron localized region provided in the light-emitting layer in the vicinity of the junction interface with the p-type semiconductor layer. These carriers efficiently undergo radiation recombination with the holes of the p-type semiconductor layer, increasing the light emission intensity with excellent monochromaticity.

The device of the invention also includes one having a configuration in which the intermediate layer is comprised of a group-III nitride semiconductor that on the side of the junction interface with the n-type light-emitting layer has a composition that is the same as, or close to, the matrix phase.

By forming the intermediate layer of a semiconductor that on the side of the junction interface with the light-emitting layer is the same as, or similar to, the matrix phase, what is substantially a homojunction between the intermediate layer and the light-emitting layer can be reliably and stably achieved, even when a light-emitting layer having a multi-phase structure is used.

The configuration may also include one in which the intermediate layer is comprised of an indium-containing group-III nitride semiconductor having a bandgap that gradually increases going toward the n-type semiconductor layer.

In such a configuration in which the intermediate layer is formed of an indium-containing group-III nitride semiconductor having a bandgap that gradually increases, going from the n-type light-emitting layer side toward the n-type semiconductor layer, the conduction band offset between the light-emitting layer and the n-type semiconductor layer can be increased smoothly in stages, going toward the n-type semiconductor layer from the n-type light-emitting layer. This therefore facilitates the channeling of carriers (electrons) from the n-type semiconductor layer side to the light-emitting layer, and contributes to the radiation recombination.

The above and other objects and features of the present invention will become apparent from the following description made with reference to the accompanying drawings.

DESCRIPTION OF THE PREFERRED EMBODIMENT

A first embodiment of the present invention will now be described with reference to FIGS. 1 to 3.

Figure 1:
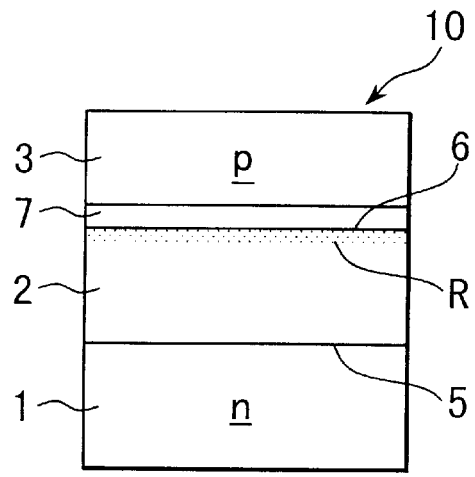
FIG. 1 is a general view showing the layer structure of the light-emitting section in a device that is a first embodiment of the group-III nitride semiconductor light-emitting device of the invention.

FIG. 1 is a general view showing the layer structure of the light-emitting section in a group-III nitride semiconductor light-emitting device according to the invention. In the drawing, the light-emitting section 10 of the group-III nitride semiconductor light-emitting device is comprised of an n-type light-emitting layer (hereinafter "light-emitting layer") 2 formed of an indium-containing group-III nitride semiconductor and disposed between an n-type semiconductor layer (hereinafter "n-type layer") 1 and a p-type semiconductor layer (hereinafter "p-type layer") 3 each formed of a group-III nitride semiconductor. Between the light-emitting layer 2 and the p-type layer 3, there is a thin layer 7 of a thickness in the range of 3 to 30 nm that is formed of a group-III nitride semiconductor and has a carrier concentration of not more than $5 \times 10^{17} cm^{-3}$. The donor concentration of the light-emitting layer 2 is from not less than $5 \times 10^{17} cm^{-3}$ to not more than $1 \times 10^{19} cm^{-3}$. A region of the light-emitting layer 2 in the vicinity of the junction interface 6 with the thin layer 7 is provided with an electron localized region R in which are selectively accumulated and localized electrons having a sheet carrier concentration of from not less than $1 \times 10^{11} cm^{-2}$ to not more than $5 \times 10^{13} cm^{-2}$.

As described in detail hereinbelow, the thin layer 7 functions effectively for the formation of the electron localized region R.

Figure 2:
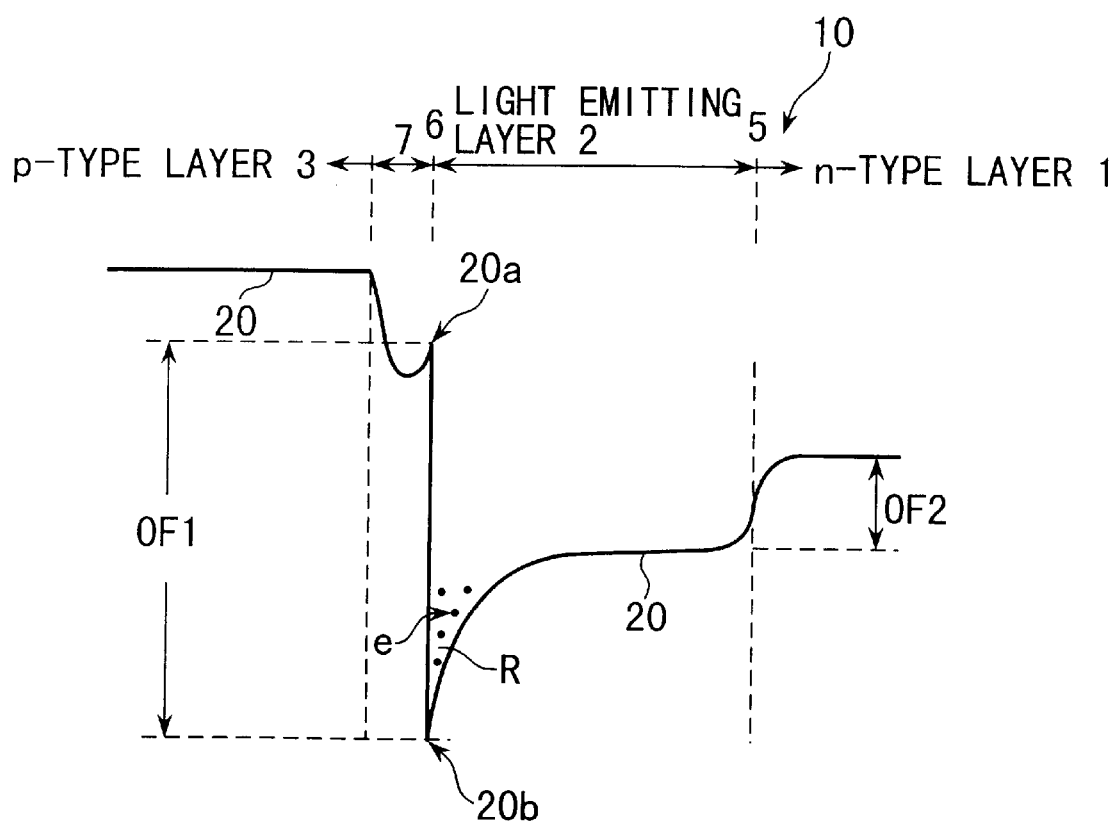
FIG. 2 is a depiction of the band configuration in the light-emitting section of the device of FIG. 1.

FIG. 2 illustrates the band configuration in the light-emitting section of the device of FIG. 1. As shown, the light-emitting section 10 has an asymmetrical, non-rectangular potential configuration. As the conduction band 20 in the light-emitting layer 2 approaches the junction interface 6 with the thin layer 7, it exhibits a large downward curvature toward the Fermi level (not shown), forming an electron localized region R in the space between the band and the junction interface 6, after which it exhibits a sharp rise in the junction interface 6, descends slightly in the thin layer 7, then ascends until it flattens out in the p-type layer 3.

Figure 17:
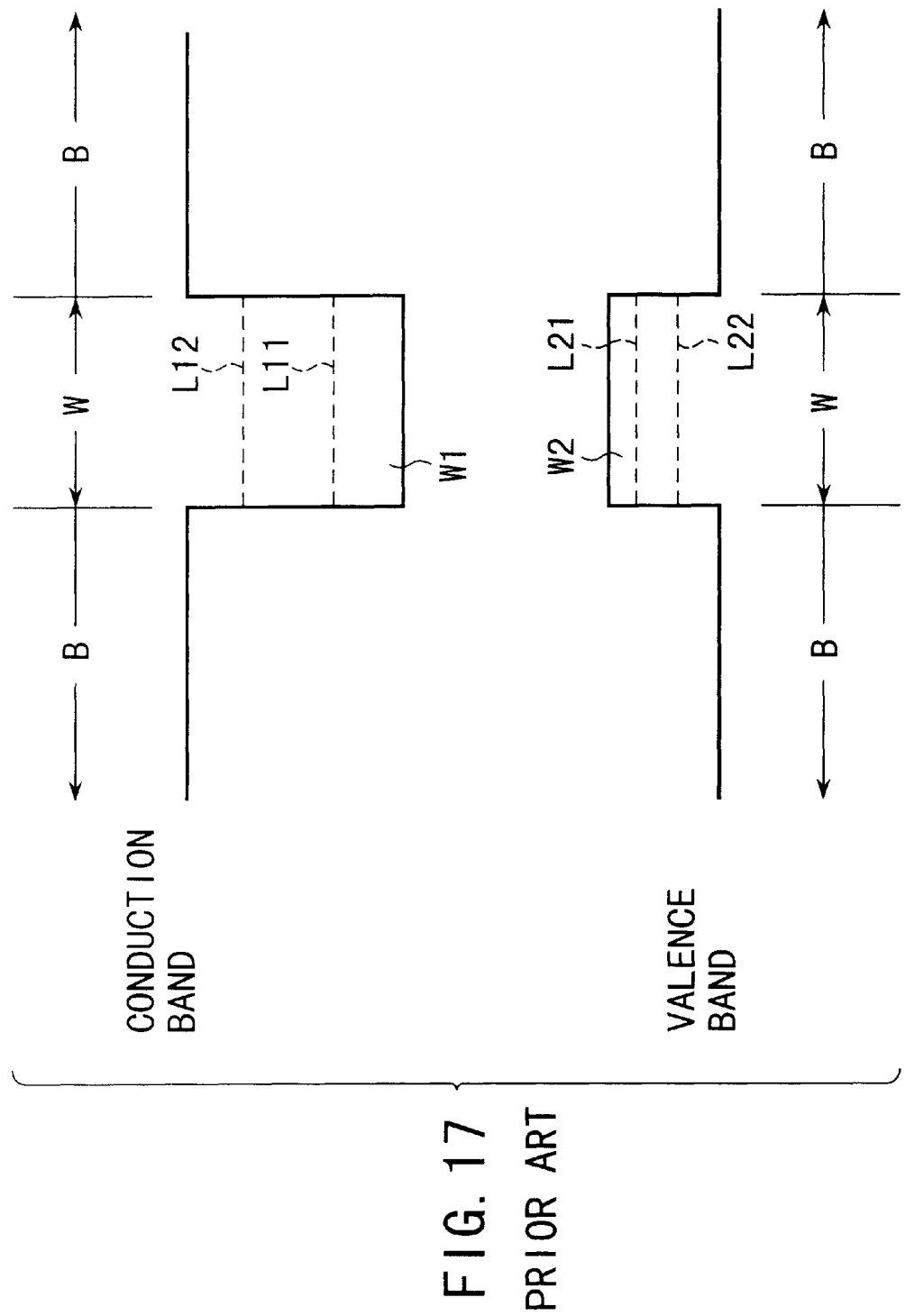
FIG. 17 shows the ideal band configuration of a conventional quantum well structure.
Figure 18:
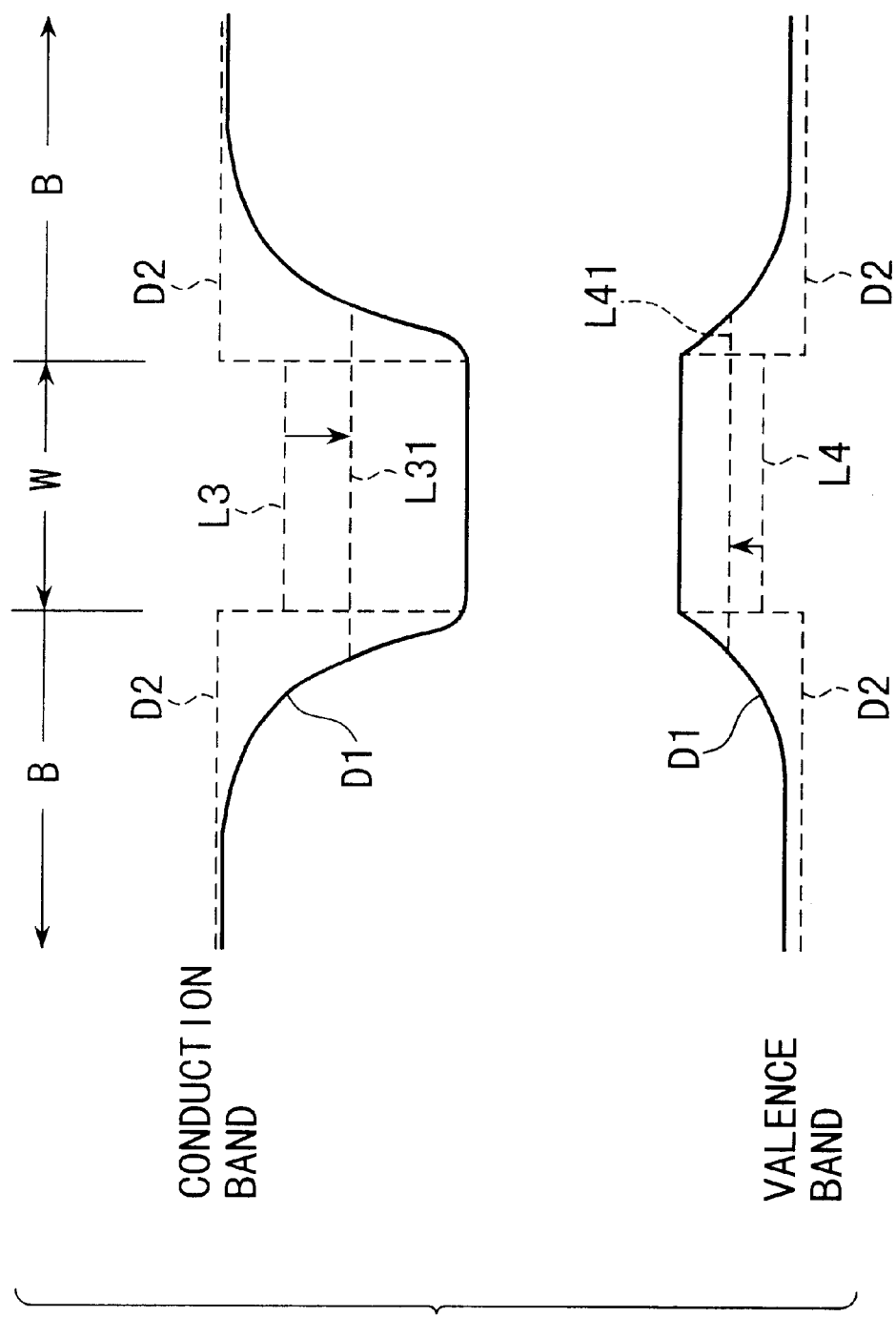
FIG. 18 shows a gradual band change between the well and barrier layers.

The conduction band offset OF1 between the light-emitting layer 2 and the thin layer 7 has the energy differential between the apex 20a reached by the conduction band 20 after its abrupt rise, and the low point 20b. In this invention, electron localized region R is created in the light-emitting layer 2 in the vicinity of the junction interface 6 by the energy differential between the conduction band exhibiting a major downward curvature near the junction interface 6, and the conduction band in the thin layer 7. Electrons e are accumulated in this electron localized region R on a preferential and selective basis. The energy differential between conduction bands referred to here is not the same as the difference between flat conduction band levels having a uniform potential differential relative to the Fermi level, as in the conventional rectangular potential well configuration (see FIG. 17).

A group-III nitride semiconductor material is used to form n-type layer 1 so that the conduction band offset OF2 between the n-type layer 1 and the light-emitting layer 2 is less than the kinetic thermal energy of electrons at room temperature (approximately 0.26 eV), generally less than 0.2–0.3 eV, preferably not more than around 0.1 eV. Such a band offset OF2 is small enough to provide no sufficient confinement of electrons in the light-emitting layer 2. The result is a pseudo-homojunction between n-type layer 1 and light-emitting layer 2. This reduction in the band offset OF2 serves to inhibit carriers (electrons) supplied from the n-type layer 1 side from staying in the junction interface 5 with the light-emitting layer 2, so the carriers are smoothly guided into the light-emitting layer 2 and are selectively and efficiently accumulated in the electron localized region R in the vicinity of the junction interface 6 with the thin layer 7. Radiation recombination efficiently takes place between these carriers and the holes of the p-type layer 3, producing light emission with increased intensity and excellent monochromaticity.

The thin layer 7 will now be described. The thin layer 7 has to produce a potential configuration whereby, under a forward bias, electrons from the n-type layer 1 flowing into the light-emitting layer 2 are accumulated in the electron localized region R in the vicinity of the junction interface 6. As such, with respect to the indium-containing group-III nitride semiconductor of the light-emitting layer 2, the group-III nitride semiconductor of which the thin layer 7 is formed has to be sufficient to effect a barrier to a conduction band of at least a room-temperature electron kinetic thermal energy of approximately 0.26 eV.

When the light-emitting layer 2 is formed of gallium indium nitride as the indium-containing group-III nitride semiconductor, it is best for the thin layer 7 to be formed of aluminum gallium nitride mixed-crystal of $Al_xGa_{1-x}N$ ($0 \leq x \leq 1$) having a lower electron affinity than that of the gallium indium nitride of light-emitting layer 2 and a large bandgap, and being also optically transparent to light ranging from ultraviolet to short wavelength visible light.

Providing an aluminum gallium nitride thin layer 7 between the p-type layer 3 and the light-emitting layer 2 increases the conduction band offset OF1 on the thin layer 7 side of the light-emitting layer 2 and makes it possible to increase the depth of the bend of the conduction band 20 at the electron localized region R in the light-emitting layer 2. The result is that electrons are confined more securely in the electron localized region R, and scattering of accumulated electrons is also suppressed.

While the thin layer 7 may have a thickness ranging from 1 nm to 60 nm, the preferred thickness is in the range of from 3 nm to 30 nm. From the standpoint of suppressing electron scattering, the thin layer 7 should have n-type conductivity and a low carrier concentration. It may even be a high-resistance or insulating layer, provided it is of a thickness that allows the manifestation of the tunneling effect (see page 72 of "Semiconductor Engineering," published by Tokyo Denki University).

The light-emitting layer 2 will now be described. The light-emitting layer 2 is constituted of an indium-containing group-III nitride semiconductor expressed by the general formula: $Al_xGa_yIn_zN$ ($x+y+z=1$; $0 \leq x$, $y \leq 1$; $z \neq 0$). A typical example is aluminum gallium indium nitride mixed-crystal. The light-emitting layer can also be formed of indium-containing group-III nitride semiconductor mixed-crystals or such mixed-crystals that in addition to nitrogen include phosphorus, arsenic or other such group-V elements (denoted by the symbol M) of the Periodic Table of Elements, as expressed by the general formula: $Al_xGa_yIn_zN_aM_{1-a}$ ($x+y+z=1$; $0 \leq x$, $y \leq 1$; $z \neq 0$; $0 < a \leq 1$).

The light-emitting layer 2 preferably has a thickness in the range of from 1 nm to 300 nm. The light-emitting layer 2 is not one that uses a rectangular potential whereby electrons are substantially uniformly distributed at the junction interface with the thin layer 7. The light-emitting layer 2 is therefore not restricted to a very small thickness in the order of several nanometers, but can instead have a relatively large total layer thickness ranging from several tens of nanometers to several hundred nanometers. Although there is a structurally preferable arrangement, the device of the present invention can use a light-emitting layer 2 having a relatively large thickness of several tens to several hundred nanometers, the thickness being the total thickness of superposed doped group-III nitride semiconductor and undoped indium-containing group-III nitride semiconductor layers.

In this invention, the light-emitting layer 2 is not a conventional single-phase structure with a homogeneous composition of indium. Instead, it is a multi-phase structure of indium-containing group-III nitride semiconductor in which the multiple phases have different indium concentrations, because compared to the single-phase structure formed of a homogeneous composition of indium, a multi-phase light-emitting layer having different indium concentrations emits light at a higher intensity.

Typical multi-phase structures include one comprised of a plurality of phases in which the matrix phase is gallium nitride or gallium indium nitride mixed-crystal with a relatively low indium concentration, and the subsidiary phase is comprised of dot-shaped crystallites of gallium indium nitride mixed-crystal in which the indium concentration is higher than that of the matrix phase material.

Since the intention of the invention is to form a light-emitting layer 2 that accumulates electrons using the non-rectangular potential well structure of the light-emitting section 10, the light-emitting layer 2 is formed with an n-type conductivity.

The electron localized region R is formed where the light-emitting layer 2 has a junction interface with a layer having a different conductivity type from that of the light-emitting layer 2. As the light-emitting layer 2 is of n-type, the electron localized region R is formed in a region of the light-emitting layer 2 in the vicinity of the junction interface 6 with the thin layer 7. This configuration is used because it is convenient with respect to effecting recombination of the accumulated electrons with holes supplied from the p-type layer 3 by forward current injection. In contrast, a configuration in which the electron localized region is formed at the junction interface with the n-type layer 1 distances the p-type layer 3 from the electron localized region, which is inconvenient because in order to ensure that the holes reach the electron localized region with good efficiency, the diffusion length of the holes has to be taken into consideration.

The light-emitting layer 2 has a prescribed donor concentration Nd. Donor concentration Nd is the concentration of the electrically activated n-type impurities. If Na is the acceptor concentration indicating the quantity of electrically activated p-type impurities, the relationship between carrier concentration N and donor concentration Nd is $N=|Nd-Na|$. In the light-emitting layer 2 in which the donors dominate so $Nd \gg Na$, carrier concentration N and donor concentration Nd are substantially equal.

There is a limit to the quantity of quantized carriers that accumulate at a quantum level located at a certain depth in the potential well. If the quantity of carriers at the quantum level in the potential well exceed the permissible state density, the volume of carriers that leave the potential well and exhibit normal three-dimensional behavior increases, and, relative to the three-dimensional carriers, there is a decrease in the proportion of quantized, lower-dimensional (two-dimensional) carriers that effect high-speed operation of the device. In other words, the electron localized region R becomes full, and the proportion of two-dimensional carriers in the electron localized region R to three-dimensional carriers in other regions decreases. This forms a major obstacle to the manifestation of good device characteristics that are based on the quantum effect.

When, conversely, there is a decrease in the quantity of carriers existing at the quantum level in the potential well, with a corresponding increase in vacancies, the result is still a decrease in the proportion of quantized, lower-dimensional carriers, relative to three-dimensional carriers, so that again, the device characteristics that are based on the quantum effect are not manifested. In other words, it is inconvenient when there is a low donor concentration Nd and few three-dimensional carriers, since the result is that fewer electrons flow into, and are accumulated in, the electron localized region R.

Thus, if the donor concentration Nd in the light-emitting layer 2 is too high or too low, the result will be that the device will be unable to sufficiently manifest the light emission characteristics that stem from the process of recombination between holes from the p-type layer 3 and electrons in the electron localized region R. Therefore, in this invention a donor concentration Nd of from not less than $5 \times 10^{17} cm^{-3}$ to not more than $1 \times 10^{19} cm^{-3}$ is specified for the light-emitting layer 2 to provide a suitable quantity of carriers in the potential well (electron localized region R). A quantity of accumulated carriers (electrons) that falls outside this range is therefore not a suitable quantity.

Also, the invention specifies the sheet carrier concentration in the region of the light-emitting layer 2 in the vicinity of the junction interface 6 where the electron localized region R is provided. The relationship between the sheet carrier concentration Ns and the carrier concentration N is $Ns = N \times d$, where d is the thickness of the light-emitting layer 2. The sheet carrier concentration Ns in the range of the donor concentration Nd (not less than $5 \times 10^{17} cm^{-3}$ to not more than $1 \times 10^{19} cm^{-3}$) is from not less than $1 \times 10^{11} cm^{-2}$ to not more than $5 \times 10^{13} cm^{-2}$. If the sheet carrier concentration Ns is outside this range, although quantized carriers are present, the proportion thereof to three-dimensional, non-quantized carriers will be decreased, with the result again being that the device will be unable to sufficiently manifest the good light emission characteristics that stem from quantized carrier recombination.

Thus, in accordance with this invention the donor concentration Nd of the light-emitting layer 2 and the sheet carrier concentration Ns at the junction interface 6 side of the light-emitting layer 2 are both specified, thereby making it possible to maintain an appropriate quantity of electrons in the electron localized region R and to maximize the light emission characteristics.

The presence or absence of localized carriers in the electron localized region R can be investigated by using the Shubnikov-de Haas (SdH) effect to measure magnetoresistance oscillations (see pp 353 to 360 of volume 2 of first printing of the fourth edition of "Semiconductor Physics" by K. Seeger, translated by Yamamoto et al. and published on Jun. 25, 1991 by K. K. Yoshioka Bookstore). The existence of localized lower-dimensional (two-dimensional) carriers can be ascertained by the appearance of the Landau level in SdH oscillations when the magnetic orientation is perpendicular to the junction interface (the measurement sample) (cf pp 42 to 46 of "Physics and Applications of Semiconductor Superlattices" cited hereinbefore). The sheet carrier concentration Ns of localized, quantized two-dimensional carriers can be obtained from the correlation between Landau level and magnetic force. The sheet carrier concentration Ns can be calculated from the carrier concentration N measured by the Hall effect method.

Forming a light-emitting layer 2 with an electron localized region R that accumulates carriers (electrons) only at the junction interface 6 with the thin layer 7 takes more than just forming layers of semiconductor having a larger bandgap than that of the light-emitting layer 2. The junction interface 6 between the thin layer 7 and the light-emitting layer 2 is the clear boundary in terms of the composition. Specifically, interface abruptness is required (cf pp 139 to 145 of "Physics and Applications of Semiconductor Superlattices" cited hereinbefore). The method of growing the layers to achieve this abrupt interface will now be described.

Methods of growing the group-III nitride semiconductor layers of the light-emitting section 10 include metal-organic chemical vapor deposition (MOCVD), molecular-beam epitaxy (MBE), and vapor-phase epitaxy (VPE) using halides and hydrides. Here, the use of MOCVD to form a configuration that ensures the abruptness of the heterojunction interface will be described.

Factors causing loss of abruptness, or what is termed "unsharpness" of the interface, include the configuration of the valves and other piping system components, thermal convection of source gases and the like in the growth reactor, and adsorption and desorption of source gases on the growth reactor walls. In particular, group-III nitride semiconductor layers (such as gallium nitride layers) are usually grown at a higher temperature, around 800° C. to 1200° C., than that used for GaAs and other group-III–V semiconductors. This means that thermal convection of source gas and the like in the growth reactor is more intense, and some of these gases remain as deposits on the reactor walls. These deposits interfere with the stable growth of gallium nitride layers. When abruptness of a heterojunction formed of a group-III nitride semiconductor is required, it is important to suppress the build-up of such deposits.

Figure 3:
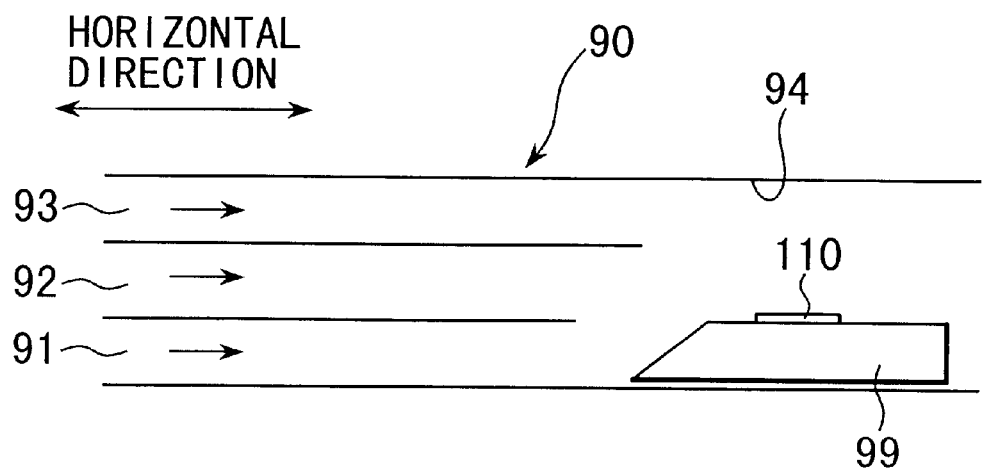
FIG. 3 shows an example of the configuration of a growth reactor used to impart abruptness to the junction interface of a group-III nitride semiconductor.

FIG. 3 shows an example of the configuration of a growth reactor used to impart abruptness to the junction interface of a group-III nitride semiconductor. In the drawing, reference numeral 90 denotes a horizontal type growth reactor in which source gases and the like are circulated substantially parallel to the surface of a substrate 110 on which growth deposition takes place. A feature of the growth reactor 90 is that it has first and second channels 91 and 92 for introducing source gases to the surface of the substrate 110 mounted on a susceptor 99, a special sweep-gas channel 93 that circulates sweep-gas for precipitating deposits on the reactor wall 94, especially deposits on the part of the reactor wall 94 below which the substrate 110 rests and on the part of the reactor wall 94 toward the front of the substrate. That is, in addition to having the channels 91 and 92, also seen on conventional horizontal type growth reactors, which are used to separately introduce into the reactor source gas of group-V elements such as nitrogen, and source gas of group-III elements such as gallium aluminum and indium, this growth reactor is also provided with the sweep-gas channel 93 for supplying sweep-gas to the reactor wall 94. The introduction of sweep-gas via the sweep-gas channel 93 is highly effective in preventing the deposit of decomposition products on the reactor wall 94. In turn, this makes it possible to stably impart abruptness to the heterojunction interface.

Preferably the sweep-gas channel 93 has a configuration that enables sweep-gas to selectively cover the part of the reactor wall 94 above the substrate 110. That is, it is preferable that the sweep-gas flow path be the one farthest away from the substrate 110. It is also preferable to keep the source gas in the central portion, restricting diffusion of the gas, by engendering a flow of sweep-gas that prevents source gases or source gas decomposition products from directly contacting the parts of the reactor wall 94 around the substrate 110.

The sweep-gas may be one normally used as a carrier gas in the MOCVD process, such as hydrogen gas or nitrogen gas, or an inert gas such as argon. Conditions such as gas type, flow rate, composition, mixture ratio and the like can be set after considering the growth temperature to be used, reaction pressure and other basic conditions, as well as the homogeneity of the resulting layer.

It is necessary to take special care to ensure the required abruptness is imparted to the junction interface 6 between the light-emitting layer 2 and the thin layer 7. On the other hand, such precise control is not required with respect to the abruptness of the junction interface 5 between the light-emitting layer 2 and the n-type layer 1. This is because using the same abruptness on the thin layer 7 side as that of the junction interface 5 tends to produce bending of the band in a region of the light-emitting layer 2 in the vicinity of the junction interface 5 with the n-type layer 1.

If the band at the junction interface 5 bends to the degree that it reaches the Fermi level, carriers (electrons) will also accumulate and localize in that region. Even if, in a region inside the light-emitting layer 2 in the vicinity of the junction interface 5 with the n-type layer 1, there is localization of the carriers (electrons) that take part in the recombination process that generates light emission, owing to the large distance that separates these carriers from the other carriers, the holes in the p-type layer 3, the diffusion length of the holes becomes a factor, and ultimately reduces recombination efficiency. Thus, it is disadvantageous from the standpoint of obtaining high-intensity light emission. To obtain high-intensity light emission, it is necessary that only the region in the vicinity of the junction interface 6 with the thin layer 7 have a band configuration (electron localized region R) that gives rise to electron localization.

The abruptness in the junction interface 5 with the n-type layer 1 can intentionally be made less than the abruptness in the junction interface 6 with the thin layer 7 by, for example, decreasing the flow rate of the sweep-gas when growing the junction interface 5. However, the sweep-gas should be kept at a sufficient flow rate to prevent deposits falling onto the substrate 110 and degrading the surface morphology.

The above configuration of the light-emitting layer 2 and thin layer 7 will now be explained in further detail. Even if no change in material and thickness is given to the light-emitting layer 2 by providing as the thin layer 7 which connect with the light-emitting layer 2 a layer having a larger modulus of elasticity than that of the light-emitting layer 2 and using measures to introduce more strain on the light-emitting layer 2, an increase in the light emission wavelength, from blue to blue-green, for example, can be observed. This can be attributed to the strain introduced into a region of the light-emitting layer 2 in the vicinity of the junction interface 6 with the thin layer 7; the effect of the drop in the conduction band in the light-emitting layer 2 is to change the wavelength of the emitted light.

When the light-emitting layer 2 is formed of gallium indium nitride having an indium composition ratio of 0.15

(15%) (Ga$_{0.85}$In$_{0.15}$N), and the thin layer 7 is formed of aluminum gallium nitride mixed-crystal having an aluminum composition ratio of x (Al$_x$Ga$_{1-x}$N: $0 \leq x \leq 1$), if the light-emitting layer 2 has a set thickness and the aluminum composition ratio x of the thin layer 7 is increased, the result is that the modulus of elasticity differential between the thin layer 7 and the light-emitting layer 2 becomes larger, producing a shift in emission wavelength from blue to green. Increasing the aluminum composition ratio x of the thin layer 7 increases the internal strain in the light-emitting layer 2. This can be interpreted as being caused by the fact that increasing the internal strain in the light-emitting layer 2 increases the downward curvature of the conduction band, decreasing the energy differential between the conduction band (quantized electron level) and valence band (hole level). Increasing the curvature of the conduction band, bending it toward the valence band, reduces the energy differential between the bands and also reduces the differential between the levels of the carriers taking part in the recombination. As such, in accordance with equation (1), the result is a lengthening of the emission wavelength.

Figure 19:
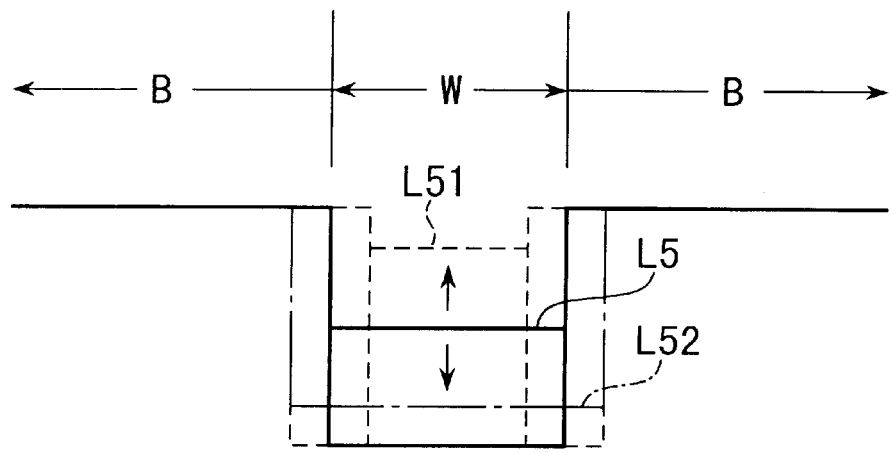
FIG. 19 is an illustration of how slight changes in the thickness (width) of the well layer produce minute changes in the quantum level.
Figure 20:
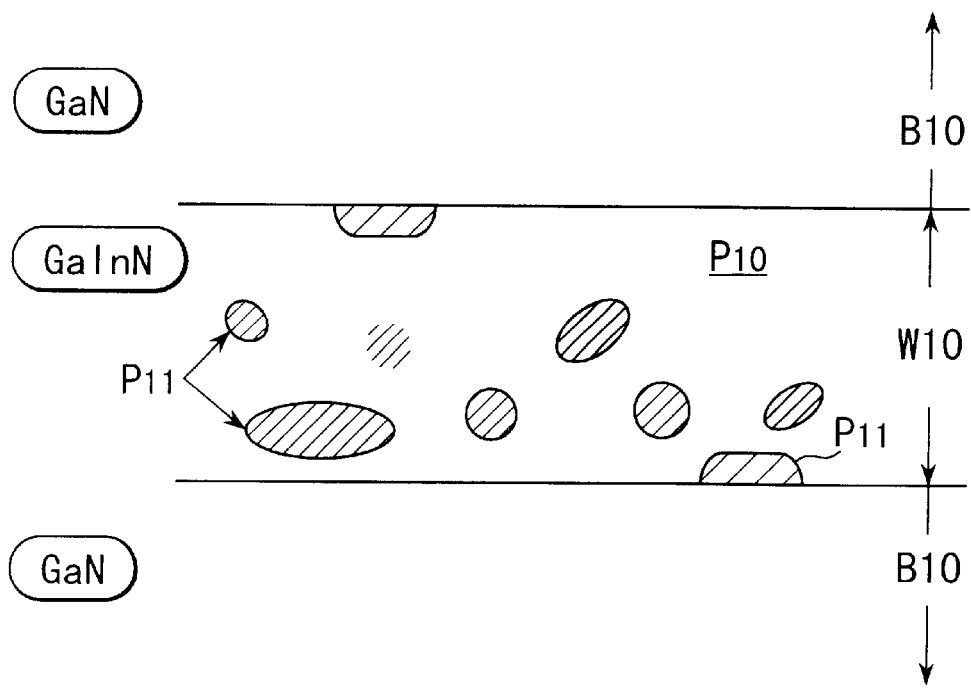
FIG. 20 shows the configuration of a light-emitting section that contains a multi-phase light-emitting layer of gallium indium nitride.
Figure 21:
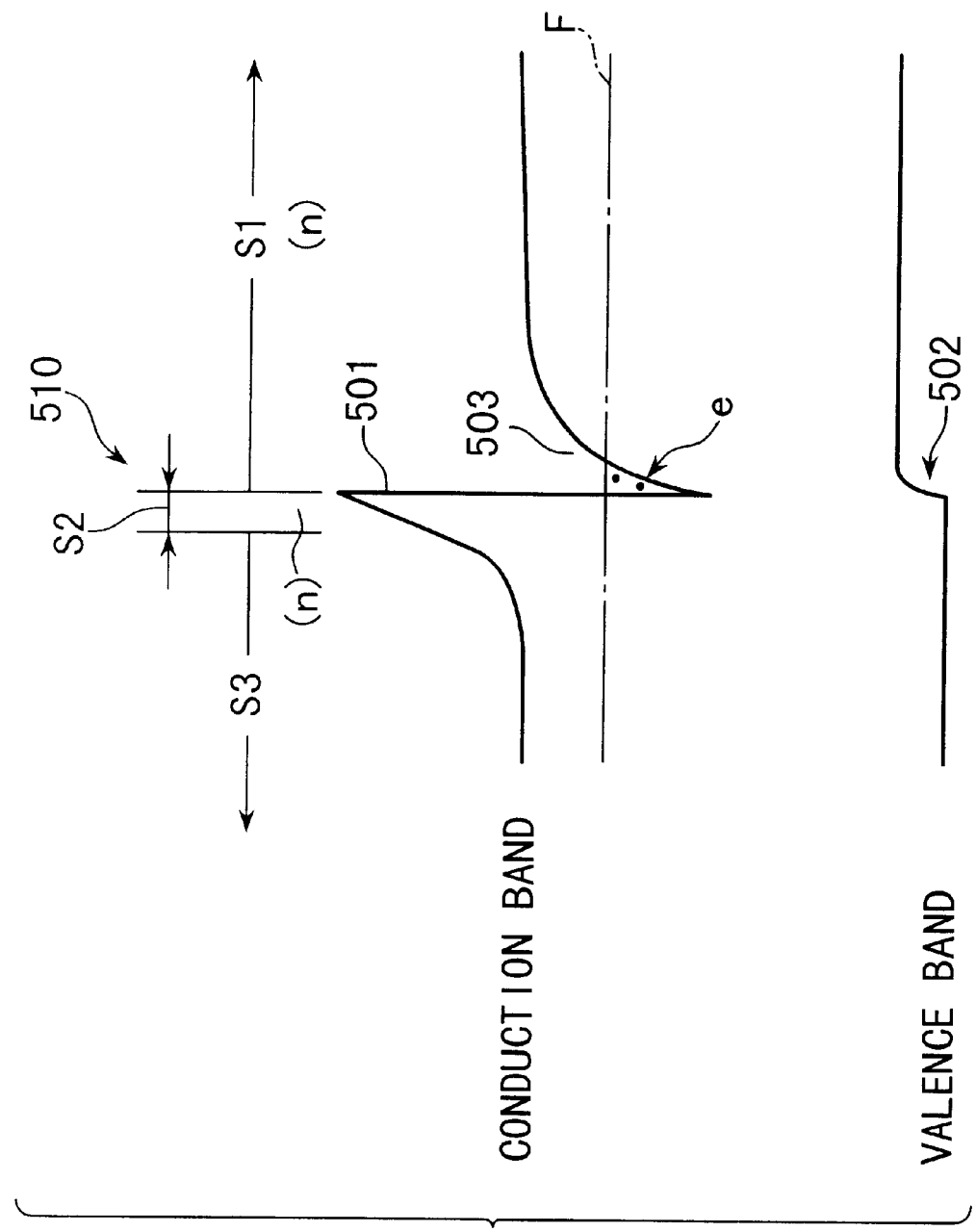
FIG. 21 shows the asymmetrical band structure of a MODFET layered structure.

Even when the thickness of the light-emitting layer 2 is reduced, the emission wavelength is still increased by increasing the internal strain in the light-emitting layer 2, increasing the curvature of the conduction band. When the thickness (width) of the well layer is decreased in the case of a light-emitting layer (well layer) that has a potential well with a conventional band structure, as shown in FIG. 19, the level of the quantized electrons is elevated and the level of the holes in the valence band is also elevated, increasing the energy differential between the bands. In accordance with equation (1), the wavelength of the emitted light is therefore shortened. Thus, in the case of the light-emitting layer 2 of this invention, the relationship between emission wavelength and potential well width produces an effect that is the opposite of that produced with the conventional quantum well structure.

As described above, in the first embodiment of the invention an electron localized region R is provided in the region of the light-emitting layer 2 in the vicinity of the junction interface with the thin layer 7. Therefore, when, under a forward bias, the holes of the p-type layer 3 diffuse into the interface 6 with the light-emitting layer 2, the holes flow into the adjacent electron localized region R and recombine with the electrons therein. Thus, recombination is smoothly effected, resulting in a high emission intensity and an eventual improvement in high-speed response of light emission and extinction.

In the case of a conventional light-emitting device comprising a rectangular potential well of a certain width, the emission wavelength fluctuates and is instable due to the factors including the facts that the control applied to the composition of the junction interface has the effect of giving gradual band changes to the light-emitting layer, that a multi-phase structure makes the band offset inconstant and that the susceptibility the light-emitting layer has to sublimation can also give rise to changes in the layer thickness. The present invention does not rely on an emission mechanism based on a rectangular band configuration. That is, in this invention the junction interface 6 is provided with a non-rectangular potential, which enables the emission wavelength to be stabilized, even if there are slight variations in the thickness of the light-emitting layer. The result is that the device exhibits good monochromaticity.

Moreover, a thin layer 7 of aluminum gallium nitride mixed-crystal having a low carrier concentration, a low electron affinity and a large bandgap is provided between the light-emitting layer 2 and the p-type layer 3, and an electron localized region is provided adjacent to the thin layer 7. This makes it possible to increase the conduction band offset OF1 and the depth of the bend in the conduction band 20 at the electron localized region R in the light-emitting layer 2. Electrons are therefore confined more securely in the electron localized region R. This results in a more efficient recombination process and better emission characteristics.

Moreover, by defining the donor concentration Nd of the light-emitting layer 2 as not less than $5 \times 10^{17}$cm$^{-3}$ to not more than $1 \times 10^{19}$cm$^{-3}$, the number of electrons that normally exhibit three-dimensional behavior in the three-dimensional space of the light-emitting layer 2 (three-dimensional carriers) is limited, making it possible to maintain the number of electrons that flow into the electron localized region at an appropriate level.

The invention also specifies that the sheet carrier concentration Ns, which depends on the quantity of electrons exhibiting mainly two-dimensional behavior (two-dimensional carriers) in the narrow region in which the electron localized region R is provided in the light-emitting layer 2 in the vicinity of the junction interface 6, be from not less than $1 \times 10^{11}$cm$^{-2}$ to not more than $5 \times 10^{13}$cm$^{-2}$. This enables the proportion of the electron localized region R accounted for by two-dimensional carriers to be maintained at an optimum level relative to the three-dimensional carriers in the three-dimensional space of the light-emitting layer 2.

Figure 4:
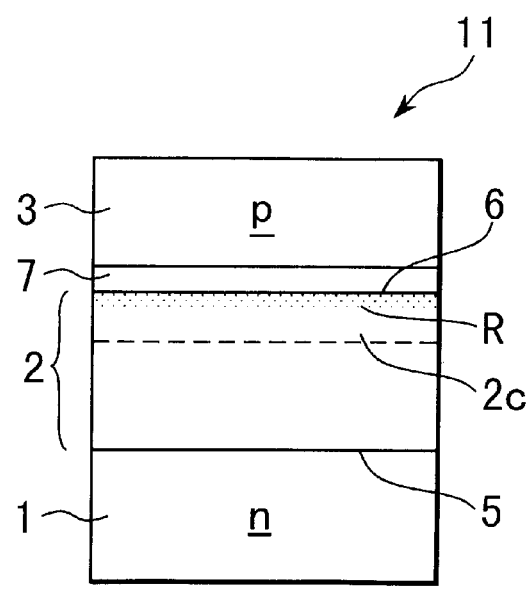
FIG. 4 is a general view showing the layer structure of a light-emitting section in a device that is a second embodiment of the light-emitting device of the invention.

FIG. 4 is a general view showing the layer structure of a light-emitting region of a device according to a second embodiment of the invention. Elements that are the same as those in the structure of the first embodiment have been given the same reference symbols, and further description thereof is omitted.

In the light-emitting section 11 of the second embodiment, a low carrier concentration layer 2c is formed in a region of the light-emitting layer 2 that is in the vicinity of the junction interface 6 with the thin layer 7. The layer 2c has an electron localized region R, and a lower carrier concentration than the carrier concentration at the junction interface 5 with the n-type layer 1. This is done to ensure that carriers accumulate more at the junction interface 6 than at the junction interface 5, and to inhibit scattering of accumulated carriers. The reason for providing the electron localized region R in the low carrier concentration layer 2c is that it facilitates the entry of electrons from surrounding region of the light-emitting layer which has a high carrier concentration, and it makes the electron localized region R a region of high purity, meaning the concentration of impurities is low, so obstacles to the channeling of electrons caused by impurities do not readily arise, allowing high-speed, two-dimensional channeling of electrons to proceed smoothly.

This carrier concentration arrangement allows growth to proceed without the matrix (constituent elements) undergoing change, and the growth process to be adjusted by the appropriate addition or withholding of dopants. The delta method is an example of a doping method that can be used (see pp 281 to 284 of the 2nd edition of "Molecular Beam Epitaxy," by M. A. Herman and H. Sitter, published by Springer-Verlag, 1996).

For the low carrier concentration layer 2c, a carrier concentration N of up to around $5 \times 10^{17}$cm$^{-3}$ is used. A higher carrier concentration increases the likelihood of scattering of localized carriers (electrons) in the electron localized region R. That is, there is a risk of high-speed channeling of two-dimensionalized carriers being obstructed by impurities.

It is preferable for the low carrier concentration layer 2c to have a width (thickness) of not more than 20 nm. Because of the low carrier concentration, if too thick a layer will only increase the conduction resistance and the forward current. Conversely, excessively reducing the thickness of the layer, such as to less than 1 nm, is also undesirable, as it reduces the size of the region in which electrons can localize without being exposed to the adverse affects of scattering and the like. It is preferable for the low carrier concentration layer 2c to have a width of at least 2 nm or so. Thus, the thickness of the low carrier concentration layer 2c is defined as between 2 nm and 20 nm.

Using a low carrier concentration layer 2c having the thickness of 2 nm to 20 nm restricts the activity of the electrons in the electron localized region R to within a two-dimensional plane, thereby limiting three-dimensional behavior and eliminating energy wastage. Since the electrons can move freely in this plane, they can actively recombine with holes, improving the light emission characteristics.

In the arrangements of the above-described embodiments, the junction between the n-type layer 1 and the light-emitting layer 2 is a pseudo-homojunction, having a band offset OF2 of less than 0.2 to 0.3 eV. However, a configuration may be used in which an intermediate layer is provided between the n-type layer 1 and the light-emitting layer 2, with the junction between the intermediate layer and the light-emitting layer 2 being a pseudo-homojunction. The light-emitting section thus configured with this intermediate layer will now be described.

Figure 5:
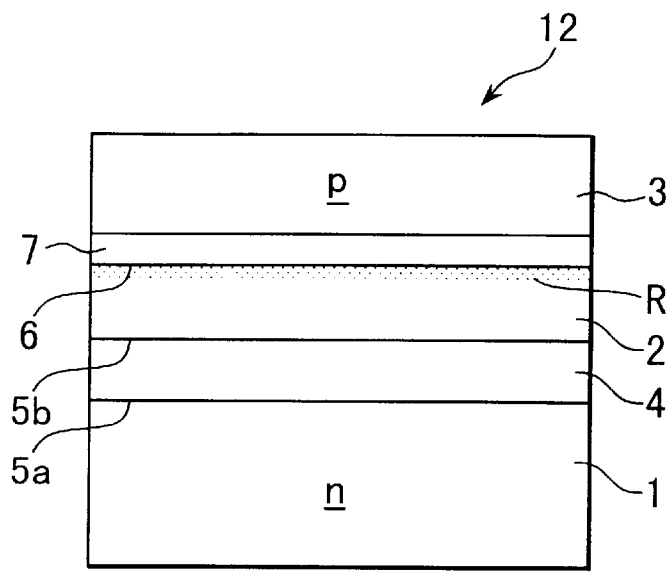
FIG. 5 is a general view showing the layer structure of a light-emitting section in a device that is a third embodiment of the light-emitting device of the invention.

FIG. 5 is a general view showing the layer structure of a light-emitting section in a light-emitting device according to a third embodiment of the invention. Elements that are the same as those in the structure of the other embodiments described above have been given the same reference symbols, and further description thereof is omitted.

In the drawing, the light-emitting section 12 of this embodiment comprises a light-emitting layer 2 disposed between an n-type layer 1 and a p-type layer 3, and a thin layer 7 disposed between the p-type layer 3 and the light-emitting layer 2, forming a double heterojunction in which the conduction band offset (discontinuity) between the light-emitting layer 2 and the p-type layer 3 is at least 0.3 eV. Provided between the n-type layer 1 and the light-emitting layer 2 is an n-type intermediate layer 4 in which the conduction band offset in the junction interface with the light-emitting layer 2 is not more than 0.2 eV.

The intermediate layer 4 is formed of a group-III nitride semiconductor having a bandgap that is not greater than the bandgap of n-type layer 1 and not less than the bandgap of light-emitting layer 2, to allow electrons from the n-type layer 1 to flow freely into the light-emitting layer 2.

The carrier concentration of the intermediate layer 4 is preferably about the same as the carrier concentration of the light-emitting layer 2. If, for example, the light-emitting layer 2 is formed of n-type gallium indium nitride with a carrier concentration of approximately $1 \times 10^{18}$ cm$^{-3}$, the intermediate layer 4 is given a carrier concentration ranging from around $1 \times 10^{17}$ cm$^{-3}$ to $1 \times 10^{19}$ cm$^{-3}$. It is undesirable to make the carrier concentration two or three orders of magnitude lower than the carrier concentration of the light-emitting layer 2, producing a high resistance, because it has the adverse effect of increasing the forward voltage.

In thickness, it is desirable for the intermediate layer 4 to be relatively thin, in the order of several nanometers, to allow full play to the carrier (electron) tunneling effect.

The intermediate layer 4 has the function of establishing a band offset, with respect to the conduction band side of the indium-containing group-III nitride semiconductor light-emitting layer 2, of not more than 0.2 eV. In other words, the intermediate layer 4 is used to reduce the conduction band offset between the n-type layer 1 and the light-emitting layer 2, to at least not more than 0.2 eV.

The band offset between the intermediate layer 4 and the n-type layer 1 does not particularly matter, and may even exceed 0.3 eV, as in the case of a junction with a conventional n-type layer 1.

To bring the conduction band offset $\Delta Ecm$ (eV) between the intermediate layer 4 and the light-emitting layer 2 to $0 \leq \Delta Ecm \leq 0.2$ specified in this invention, the intermediate layer 4 has to be formed of a group-III nitride semiconductor in which the bandgap differential $\Delta Egm$ relative to the light-emitting layer 2 is $0 \leq \Delta Egm \leq 0.2/\alpha$. Here, $\alpha$ is the distribution ratio and $\Delta Ecm$ is some proportion of $\Delta Egm$; that is, it is a coefficient indicating the contribution to the conduction band offset.

If, for example, the light-emitting layer 2 is formed of n-type gallium indium nitride having an indium composition ratio of 5% (0.05) (Ga$_{0.95}$In$_{0.05}$N), as an example of material that would form a suitable intermediate layer 4 for the light-emitting layer 2, there is gallium nitride with a bandgap differential $\Delta Egm$ of approximately 0.16 eV, and assuming an $\alpha$ of 69% (0.69) in a GaN/InN heterojunction structure (see FIG. 9 on page 129 of Mat. Res. Soc. Symp. Proc. Vol. 395 (1996)), a band offset $\Delta Ecm$ of 0.11 eV.

In the case of a light-emitting layer 2 formed of n-type gallium indium nitride having an indium composition ratio of 20% (0.20) (Ga$_{0.80}$In$_{0.20}$N), there can be used an intermediate layer 4 of gallium indium nitride that satisfies the conditions $0 \leq \Delta Egm \leq 0.2/\alpha$ and $0 \leq \Delta Ecm \leq 0.2$ (Ga$_{1-d}$In$_d$N: $0 \leq w \leq 1$), in which, assuming an $\alpha$ of 0.69, the indium composition ratio (d) would be set at up to around 0.10.

As another example, if the light-emitting layer 2 is formed of indium nitride, the intermediate layer 4 can be constituted of gallium indium nitride (Ga$_{1-d}$In$_d$N) having an indium composition ratio (d) of not less that 0.35.

The conduction band offset between the intermediate layer 4 and the light-emitting layer 2 may be zero, that is: $\Delta Ecm=0$. An offset of zero is achieved when the junction between the same semiconductor materials is a homojunction. In such cases, the junction formats with respect to the light-emitting layer 2 are divided into heterojunctions in which the conduction band offset relative to the thin layer 7 exceeds 0.3 eV, and homojunctions in which in the junction with the intermediate layer 4, $\Delta Ecm=0$. Therefore, when the light-emitting layer 2 and intermediate layer 4 are formed of the same type of group-III nitride semiconductor, the junction with respect to the light-emitting layer 2 is a single heterojunction (SH junction). Also, even if $\Delta Ecm$ is not 0 eV, this invention specifies a maximum $\Delta Ecm$ of 0.2 eV. Thus, the band offset between the intermediate layer 4 and the light-emitting layer 2 is not enough to act as a barrier.

Thus, junction system according to this invention is not the simple type of conventional double heterojunction (DH junction) comprised of a light-emitting layer 2 and layers 1 and 3, but is instead a DH junction structure that with respect to the light-emitting layer, contains an SH junction.

The fact that the layer (intermediate layer 4) adjoining one side of the light-emitting layer 2 is constituted as a semiconductor layer that does not have the ability to act as a barrier, decisively differentiates the junction configuration relative to the light-emitting layer 2 of this invention from the conventional junction configurations.

Figure 6:
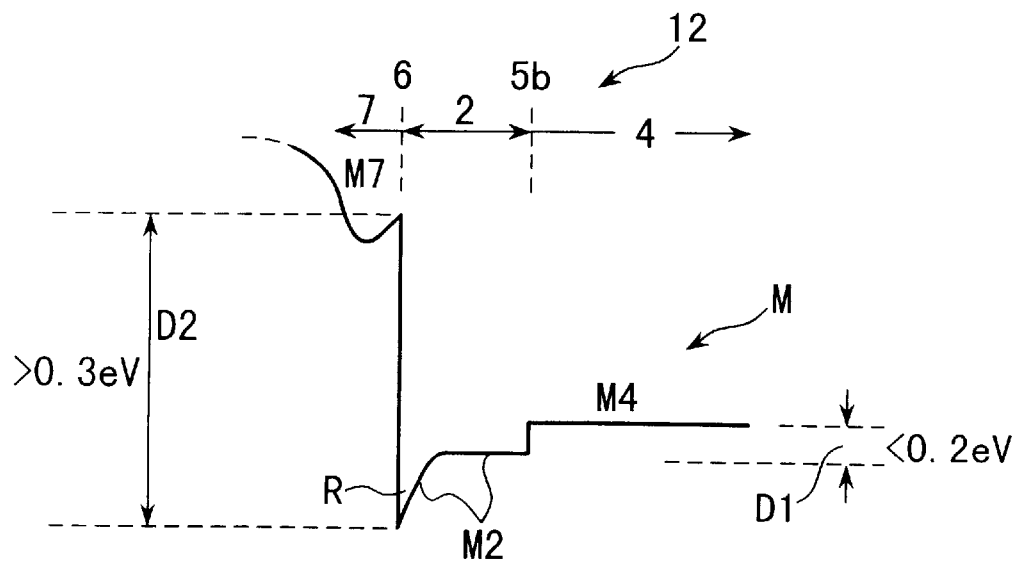
FIG. 6 is a depiction of the conduction band configuration in the device of FIG. 5.

FIG. 6 illustrates the conduction band configuration of this embodiment. In the drawing, the conduction band configuration M of the light-emitting section 12 comprises conduction band M4 of the intermediate layer 4, conduction band M2 of the light-emitting layer 2, and conduction band M7 of the thin layer 7. In the band configuration M at which the present invention is directed, the conduction band offset D2 (=M7−M2) in the junction interface 6 between the thin layer 7 and the light-emitting layer 2 is large enough to exceed around 0.3 eV, and the conduction band offset D1 (=M4−M2) in the junction interface 5b between the light-emitting layer 2 and the intermediate layer 4 is set at not more than 0.2 eV. Electron localized region R is formed on the light-emitting layer 2 side of the junction interface 6.

When a forward drive voltage is applied, the location of the intermediate layer 4 prevents electrons supplied from the n-type layer 1 being trapped in the junction interface between the light-emitting layer 2 and the n-type layer 1. Thus, the electrons are able to be smoothly guided to the electron localized region R. Thus, the junction configuration of this invention efficiently and selectively effects accumulation and localization of electrons in the electron localized region R.

The setting of the intermediate layer 4 will now be described with reference to the case where the light-emitting layer 2 is comprised of matrix and subsidiary phases.

Figure 7:
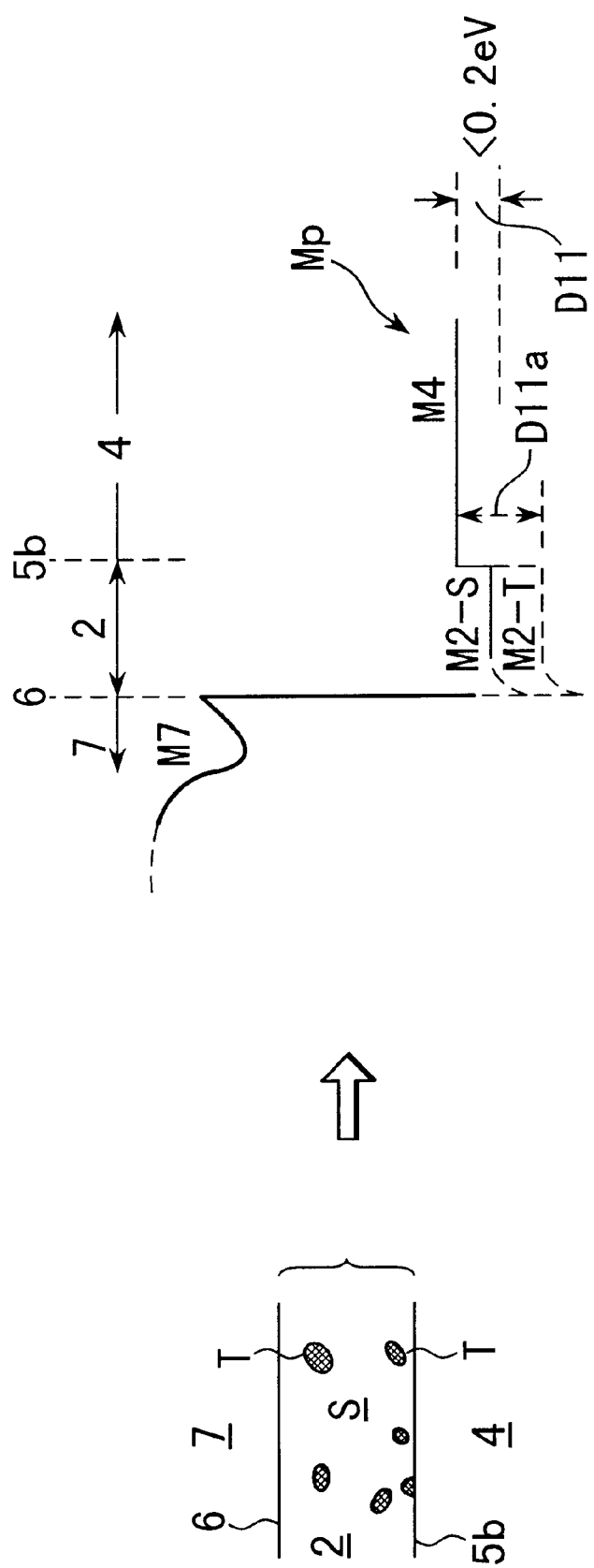
FIG. 7 shows the band configuration in the case of the device of FIG. 5 when the light-emitting layer is a multi-phase structure formed of indium-containing group-III nitride semiconductor.

FIG. 7 shows the band configuration in the case of the device of FIG. 5, when the light-emitting layer has a multi-phase structure formed of an indium-containing group-III nitride semiconductor. In the drawing, light-emitting layer 2 is formed of indium-containing group-III nitride semiconductor in which the matrix phase S and subsidiary phase T are separated. Matrix phase S and subsidiary phase T both face the junction interface 5b between the intermediate layer 4 and the light-emitting layer 2. The matrix phase S and subsidiary phase T have different indium concentrations, with the indium concentration (composition ratio) of the subsidiary phase T being higher than that of the matrix phase S. In the case of gallium indium nitride, increasing the indium composition ratio decreases the bandgap. That is to say, therefore, the matrix phase S has a larger bandgap than that of the subsidiary phase T.

As shown by the band configuration Mp, the band offset D11 between the conduction band M4 of the intermediate layer 4 and the conduction band M2−S of the matrix phase S is set to be not more than 0.2 eV. This is achieved by forming the intermediate layer 4 of a material that is the same as, or close to, that of the matrix phase S.

Since the matrix phase S has a larger bandgap than the subsidiary phase T, the band offset of the conduction band in the junction interface 5b differs depending on whether the other side is the subsidiary phase T or matrix phase S. If the intermediate layer 4 is comprised of the same material as the subsidiary phase T, the conduction band M4 of the intermediate layer 4 will be smaller than the conduction band M2−S of the matrix phase S. This being the case, for much of the region in the vicinity of the junction interface 5b where the matrix phase S dominates, the conduction band of the intermediate layer 4 forms a dip in which electrons flowing in from the n-type layer 1 become trapped. Conversely, when the intermediate layer 4 is formed of the same material as the matrix phase S, the band offset D11a (=M4−(M2−T)) between the subsidiary phase T and the intermediate layer 4 exceeds 0.2 eV. However, in most of the region in the vicinity of the junction interface 5b where matrix phase S predominates, a band offset D11 not exceeding 0.2 eV is maintained. This is why the intermediate layer 4 is formed of a material that is the same as, or close to, that of the matrix phase S, rather than that of the subsidiary phase T. This configuration enables what is substantially a homojunction to be securely and stably realized between the intermediate layer 4 and the light-emitting layer 2, even when a light-emitting layer 2 having a multi-phase structure is used.

In the case of a light-emitting layer 2 having a multi-phase structure of gallium indium nitride in which, for example, gallium nitride is used for the matrix phase and the subsidiary phase is formed of gallium indium nitride having a higher indium composition ratio than that of the matrix phase, the intermediate layer 4 is formed of gallium nitride.

In the case of a light-emitting layer 2 having a multi-phase structure of gallium indium nitride in which, for example, the matrix phase is formed of gallium indium nitride with an indium composition ratio of 0.06 (6%) ($Ga_{0.94}In_{0.06}N$) and the subsidiary phase is formed of gallium indium nitride with an indium composition ratio of 0.10 (10%) ($Ga_{0.90}In_{0.10}N$), the intermediate layer 4 is formed of gallium indium nitride having an indium composition ratio of 0.06.

The intermediate layer 4 according to this invention is provided to reduce the conduction band offset that would exceed 0.3 eV if the light-emitting layer and n-type layer were in direct contact. As such, the intermediate layer 4 does not necessarily have to be a single layer, but may instead be comprised of a multiplicity of layers that serve to decrease the band offset in increments.

When the light-emitting layer 2 is thus formed as a multi-phase structure of a matrix phase and subsidiary phase having different indium concentrations, the intermediate layer 4 is formed of a group-III nitride semiconductor having a composition that is the same as, or close to, that of the matrix phase, so that the band offset in the junction interface 5b between the light-emitting layer 2 and the matrix phase is not more than 0.2 eV. Thus, the composition of the intermediate layer 4 is directed at the matrix phase which predominates in the junction interface 5b. This enables what is substantially a homojunction between the intermediate layer 4 and the light-emitting layer 2 to be securely and stably effected even when the light-emitting layer 2 has a multi-phase structure.

Figure 8:
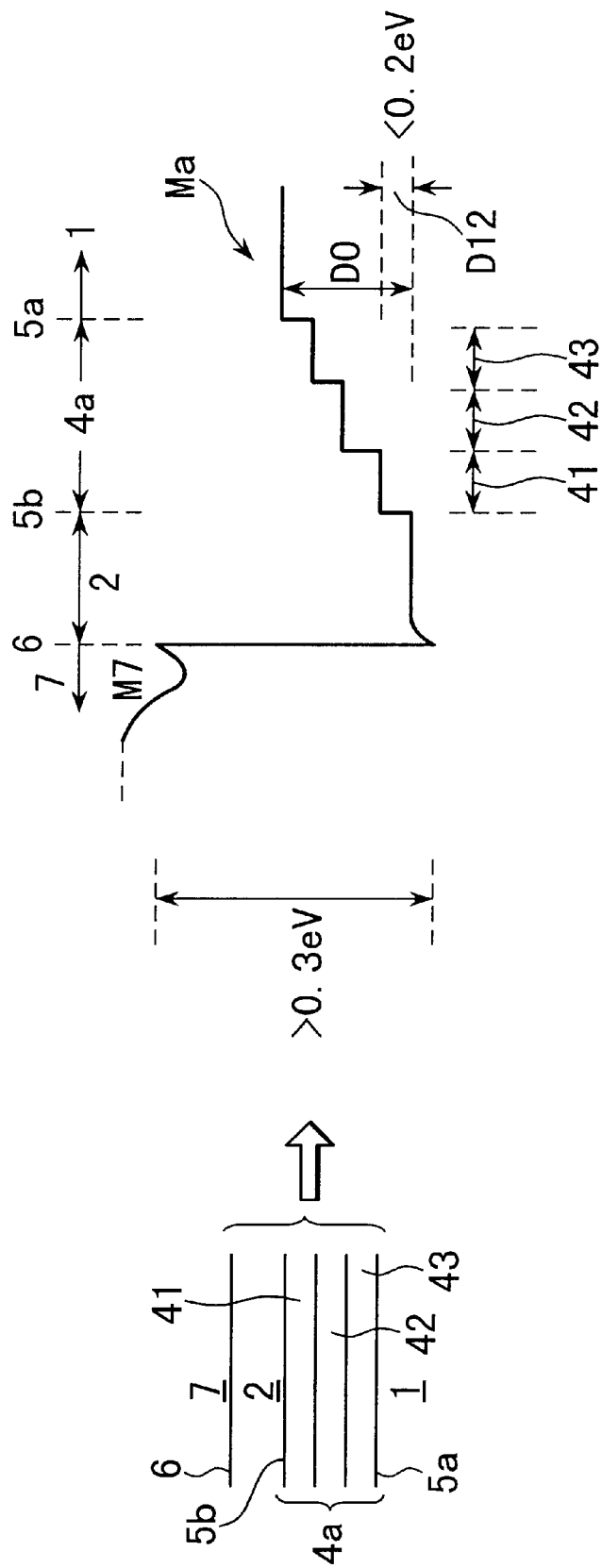
FIG. 8 is a general view of an example of the conduction band configuration in the device of FIG. 5 in which an intermediate layer having a low offset is disposed between the light-emitting layer and the n-type layer.

FIG. 8 is a general view of an example of a conduction band configuration when an intermediate layer is used to reduce the offset between the light-emitting layer and the n-type layer. In the band configuration Ma shown in FIG. 8, the conduction band offset D0 between a light-emitting layer 2 and an n-type layer 1 is incrementally reduced by using an intermediate layer 4a comprised of the three sub-intermediate layers 41, 42 and 43. Of these, the sub-intermediate layer 41 that forms a junction with the light-emitting layer 2 is a group-III nitride semiconductor layer in which the conduction band offset D12 relative to the light-emitting layer 2 is not more than 0.2 eV.

When the intermediate layer is formed of a plurality of sub-intermediate layers that start from layer 41, the intermediate layer is given a band configuration as shown in FIG. 8 whereby the conduction band increases in incremental steps, going from the light-emitting layer 2 toward the n-type layer 1. If the band configuration formed by these sub-intermediate layers had ups and downs (dips), the dips would trap carriers, reducing the quantities of carriers that should flow into the region of the light-emitting layer 2 in the vicinity of the junction interface 6 with the thin layer 7. This type of band configuration that increases the conduction band energy in steps going from the light-emitting layer 2 toward the n-type layer 1 can be formed by constituting each sub-intermediate layer of semiconductor material having a bandgap that is larger than that of the indium-containing group-III nitride semiconductor of the light-emitting layer 2 and smaller than that of the n-type layer 1 semiconductor material, and by gradually increasing the bandgap going from the light-emitting layer 2 toward the n-type layer 1.

Thus, in accordance with the above configuration the conduction band offset between the light-emitting layer 2 and the n-type layer 1 is decreased in incremental steps, going from the n-type layer 1 toward the light-emitting layer 2. As a result, carriers (electrons) supplied from the n-type layer 1 side do not remain in the junction interfaces 5a and 5b but flow smoothly to the light-emitting layer 2 and take part in the radiation recombination process. This configuration also contributes to the production of the valence band offset. Since this band offset is changed in increments, it also serves to suppress exudation of holes from the light-emitting layer 2 to the n-type layer 1.

Figure 9A:
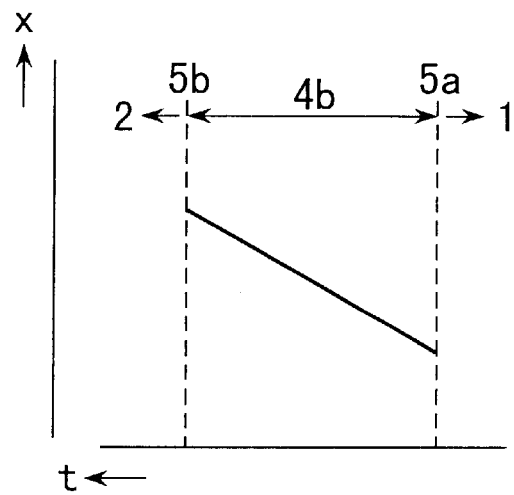
FIG. 9(a) illustrates the use, in the device of FIG. 5, of an intermediate layer in which the indium concentration decreases linearly, going from the light-emitting layer to the n-type layer.
Figure 9B:
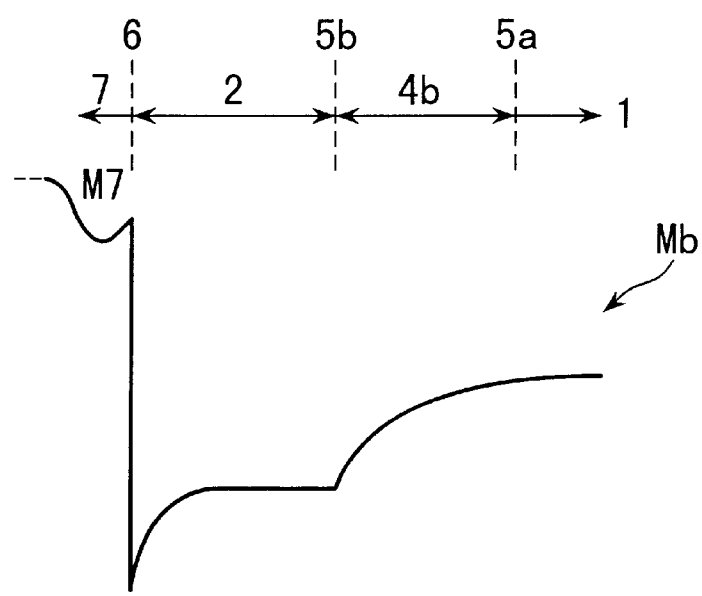
FIG. 9(b) shows the conduction band configuration, in the case of the device of FIG. 5, when the indium concentration of the intermediate layer changes in the way shown in FIG. 9(a).

The above description was made with reference to an intermediate layer 4 or each of the sub-intermediate layers 41, 42 and 43 formed with a substantially constant composition. However, a configuration may be used in which the composition changes continuously within the layers. FIG. 9(a) shows an example of an intermediate layer 4b comprised as a composition gradient layer with respect to the indium concentration x; that is, the intermediate layer is one in which the indium concentration x decreases linearly relative to layer thickness t, going toward the n-type layer 1 from the light-emitting layer 2. FIG. 9(b) shows the band configuration Mb from the light-emitting layer 2 to the n-type layer 1, in the case of the intermediate layer 4b thus comprised as a composition gradient layer, showing the stepless increase in the bandgap corresponding to the gradient of the indium concentration x. This configuration enables the carriers to move toward the light-emitting layer 2 even more smoothly than in the incrementally stepped band offset configuration.

Figure 10:
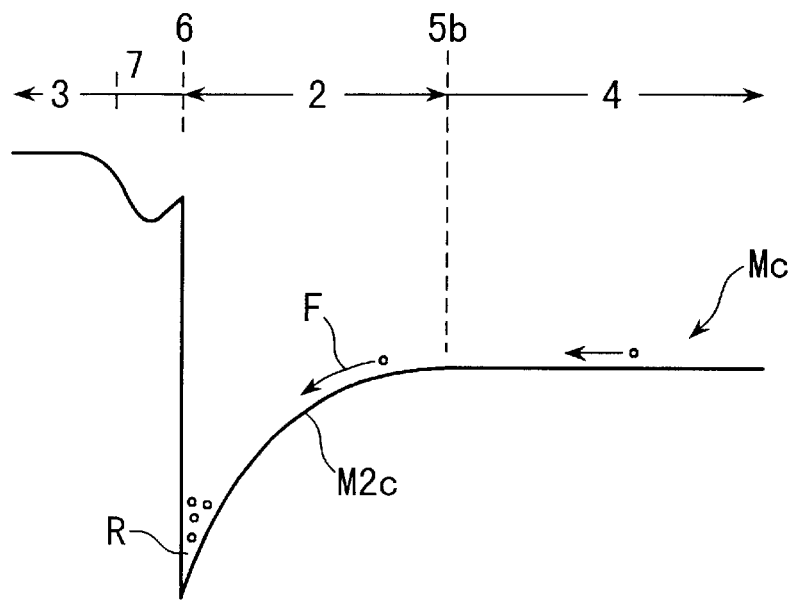
FIG. 10 shows an example of a preferred conduction band configuration in the device of FIG. 5.

FIG. 10 shows an example of a preferred conduction band configuration according to the third embodiment. As shown in the illustrated band configuration Mc, as the conduction band M2c in the light-emitting layer 2 approaches the junction interface 6 with the thin layer 7, it exhibits a large downward curvature, forming an electron localized region R in the space between the band and the junction interface 6, after which it exhibits a sharp rise in the junction interface 6, dips slightly in the thin layer 7, then ascends and flattens out in the p-type layer 3. Going the other way, as the conduction band M2c nears the junction interface 5b with the intermediate layer 4, it smoothly flattens out, forming a homojunction between the light-emitting layer 2 and the intermediate layer 4, and continues on a flat course through the intermediate layer 4.

When the light-emitting section 10 has this type of band configuration (potential configuration), electrons supplied from the n-type layer 1 do not stay in the vicinity of the junction interface 5b but are instead guided smoothly into the light-emitting layer 2, then in the direction indicated in FIG. 10 by arrow F, via which they flow into the electron localized region R where they are efficiently accumulated. The accumulated electrons efficiently undergo radiation recombination with the holes of the p-type layer 3, enhancing the emission output and monochromaticity.

In terms of electrical conductivity types, the preferred junction configuration in the light-emitting section 12 of this third embodiment is n (n-type layer 1)/n (intermediate layer 4)/n (light-emitting layer 2)/n (thin layer 7)/p (p-type layer 3). Each slash (/) represents a junction. The n-type layer 1 functions as an n-type cladding layer and the p-type layer 3 functions as a p-type cladding layer. Thus, the junction configuration of this invention has a pn junction type DH junction that includes at least two n/n junctions.

In terms of the band configuration, the junction interface 5b between the light-emitting layer 2 and the intermediate layer 4 is given a potential barrier of up to 0.2 eV at room temperature. Because a potential barrier is not formed at the conduction band side of the junction interface 5b between the intermediate layer 4 and light-emitting layer 2, ideally the intermediate layer 4 is formed of the same material as that of the light-emitting layer 2. As before, the junction between the thin layer 7 and the light-emitting layer 2 is given a band offset of over 0.3 eV.

From the aspect of electron theory based functions or effects, of the junctions with the light-emitting layer 2, the junction with the intermediate layer 4 is a homojunction that does not have a sufficient carrier (electron) confinement (cladding) effect. In contrast, the junction with thin layer 7 is a heterojunction having a barrier that is much greater than band offset of the junction between the intermediate layer 4 and the light-emitting layer 2. The band offset across the junction interface 6 between the light-emitting layer 2 and the thin layer 7 is produced to form a good band configuration for accumulating electrons at the junction interface 6 side. The result is a heterojunction between the light-emitting layer 2 and the thin layer 7 having a potential barrier (electron localized region R) on the conduction band side that is effective for accumulating carriers, especially electrons, and a homojunction between the light-emitting layer 2 and intermediate layer 4.

Examples of the invention will now be described in more specific detail, with reference to a group-III nitride semiconductor light-emitting device (LED) having the inventive junction configuration. In each of the Examples, a layered structure is formed and used to fabricate an LED. However, the invention should not be limited to these Examples.

EXAMPLE 1

First, fabrication of an LED provided with the band configuration shown in FIG. 10 will be described.

Figure 11:
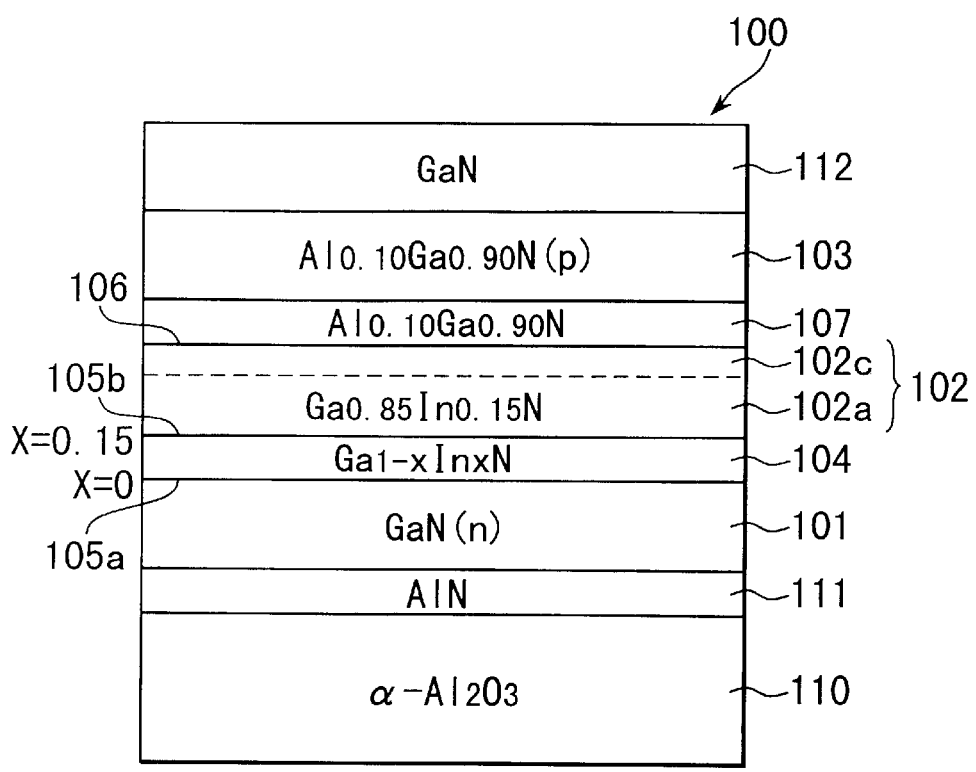
FIG. 11 is a cross-sectional view of the structure of an LED according to the first embodiment.

FIG. 11 is a cross-sectional view of the layered structure according to Example 1. In the drawing, layered structure 100 is formed using a substrate 110 of (0001)(c surface)-sapphire ($\alpha$-$Al_2O_3$ single crystal). An AlN buffer layer 111 having a thickness d of 20 nm is formed on the substrate 110, followed by an n-type layer (d=3 $\mu$m) 101 of Si-doped GaN having a carrier concentration n of approximately $1 \times 10^{18} cm^{-3}$.

Formed on the n-type layer 101 is a gallium indium nitride intermediate layer 104 having an indium composition gradient that increases the indium composition ratio from zero at a junction interface 105a with the n-type layer 101 to 0.15 at the layer thickness of 15 nm.

A light-emitting layer (d=7.5 nm) 102a of $Ga_{0.85}In_{0.15}N$ having a fixed indium composition ratio is formed on the intermediate layer 104. The donor concentration of the light-emitting layer 102a is approximately $4 \times 10^{18} cm^{-3}$. An n-type low carrier concentration layer 102c of undoped $Ga_{0.88}In_{0.12}N$ is formed on the light-emitting layer 102a. The low carrier concentration layer 102c has a thickness d of 7 nm and a carrier concentration n of $3\times10^{17}\text{cm}^{-3}$. A light-emitting layer 102 is comprised of the low carrier concentration layer 102c and the light-emitting layer 102a.

In order to measure the sheet carrier concentration of the low carrier concentration layer 102c, a structure was fabricated comprising an undoped layer of n-type $Al_{0.10}Ga_{0.90}N$ having a carrier concentration of less than $5\times10^{15}\text{cm}^{-3}$ formed on a light-emitting layer grown under the same conditions. A thickness of 10 nm was set for the n-type $Al_{0.10}Ga_{0.90}N$ layer so that under zero bias the depletion layer would extend to the surface layer of the light-emitting layer. The sheet carrier concentration was $3.2\times10^{12}\text{cm}^{-2}$, according to a Hall effect measurement utilizing van der Pauw with an aluminum ohmic electrode.

The light-emitting layer 102 was grown using the above-described three-channel growth reactor 90 in which one channel was used to circulate a carrier gas of argon at a flow rate of two liters a minute. After completion of the formation of the light-emitting layer 102, the argon flow was increased to five liters a minute to act as a sweep-gas for expelling from the growth reactor 90 any deposits or residual, non-decomposed source gas and the like. This expulsion is effected in order to form an abrupt composition gradient in the junction interface 106 between the light-emitting layer 102 and the thin layer 107. It was confirmed that a growth environment had been established that allowed an interface with good abruptness to be created with no clearly visible globules of gallium or other metals adhering to the wall 94 of the growth reactor 90.

An undoped high-resistance thin layer 107 of n-type $Al_{0.10}Ga_{0.90}N$ was formed on the low carrier concentration layer 102c. This thin layer 107 had a carrier concentration of $3\times10^{6}\text{cm}^{-3}$ and a thickness of approximately 4 nm.

A p-type layer (d=0.2 $\mu$m) 103 of Mg-doped $Al_{0.10}Ga_{0.90}N$ having a carrier concentration of approximately $8\times10^{16}\text{cm}^{-3}$ was formed on the thin layer 107, then a p-type top surface layer (d=0.1 $\mu$m) 112 of GaN doped with Mg and Zn and having a carrier concentration of approximately $2\times10^{17}\text{cm}^{-3}$ was formed on the p-type layer 103, thereby fabricating the layered structure 100.

The layered structure 100 was grown by a normal pressure MOCVD method, using the above-described three-channel growth reactor 90. The buffer layer 111 was grown at 450° C. The intermediate layer 104 with the indium composition gradient and the light-emitting layer 102 with the low carrier concentration layer 102c were grown at 890° C. The n-type layer 101, p-type layer 103 and p-type top surface layer 112 were grown at 1050° C. The temperature elevation from the light-emitting layer 102 growth temperature of 890° C. to the p-type layer 103 growth temperature of 1050° C. was effected rapidly, in 1.5 minutes, to reduce the extent of the vaporization of the GaInN of the light-emitting layer 102. For each layer, ammonia ($NH_3$) was used as the nitrogen source. Group-III source elements were trimethyl aluminum (($CH_3)_3Al$), trimethyl gallium (($CH_3)_3Ga$) and trimethyl indium (($CH_3)_3In$).

A secondary ion mass spectrometer (SIMS) was used to measure the depthwise concentration distribution of indium and aluminum atoms in the junction interface 106 between the low carrier concentration layer 102c of the light-emitting layer 102 and the thin layer 107.

Figure 12:
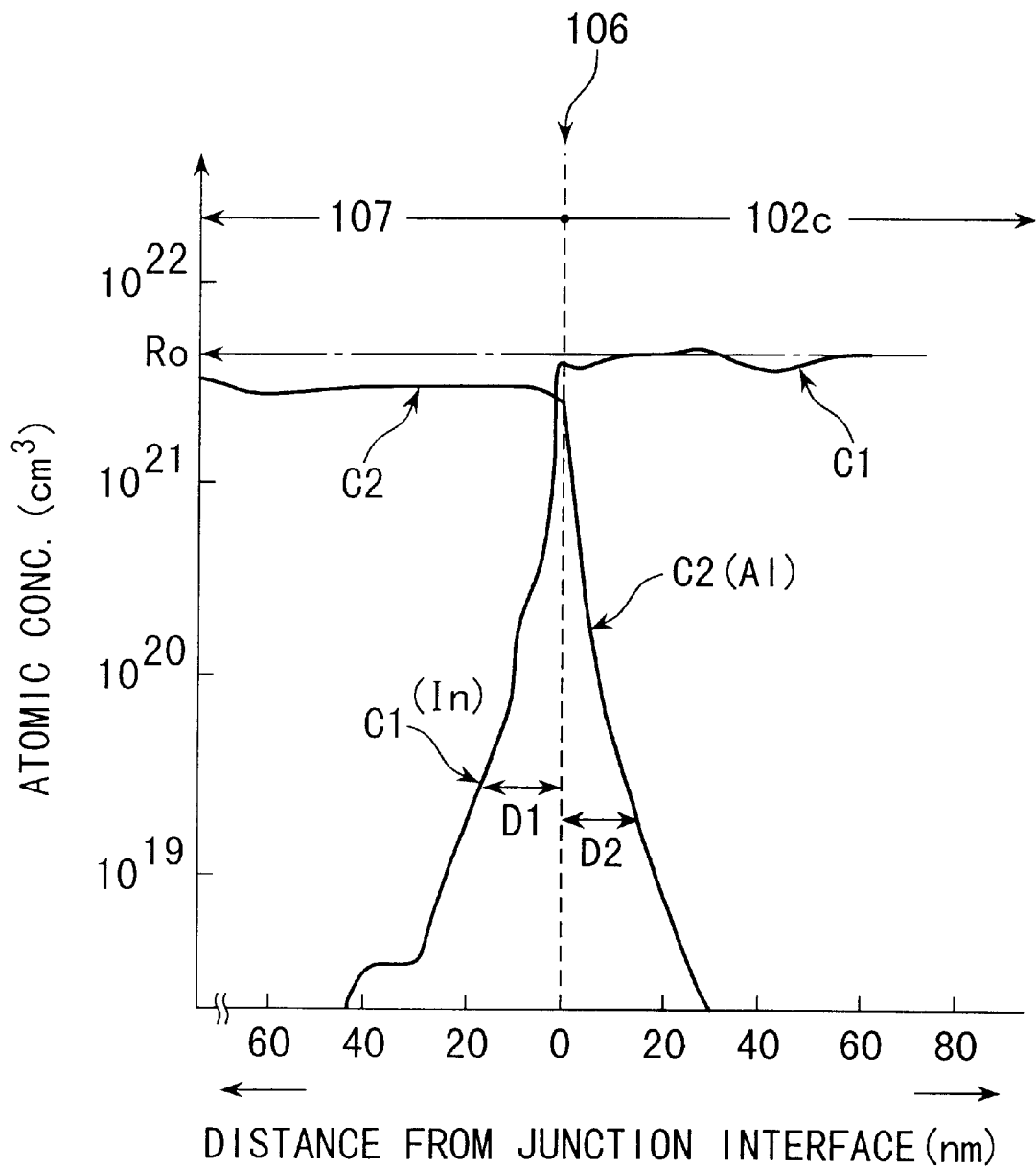
FIG. 12 is a concentration profile of the indium and aluminum in the junction interface between the light-emitting layer and the thin layer in the LED of FIG. 11.

FIG. 12 shows the concentration profile of the indium and aluminum atoms in the junction interface 106, in which the lateral axis stands for the distance from the junction interface 106 and the vertical axis for the atomic concentration. In the indium atomic concentration profile C1, a transition distance D1 from the junction interface 106 to a point on the profile C1 at which the indium concentration is $6.6\times10^{19}$ atoms/cm$^3$ that is two orders of magnitude lower than that at a concentration point Ro at which the indium atomic concentration in the low carrier concentration layer 102c becomes approximately constant, was found to be about 18 nm. In the aluminum atomic concentration profile C2, a transition distance D2 from the junction interface 106 to a point on the profile C2 at which the aluminum concentration is two orders of magnitude lower than that at a point at which the aluminum concentration in the thin layer 107 becomes approximately constant, was found to be about 15 nm. Thus, the concentration profiles C1 and C2 both show a sharp drop across the junction interface 106, indicating the existence of a clear boundary and thereby satisfying the interface abruptness condition.

A light-emitting diode (LED) was fabricated using the layered structure 100 as the parent material.

Figure 13:
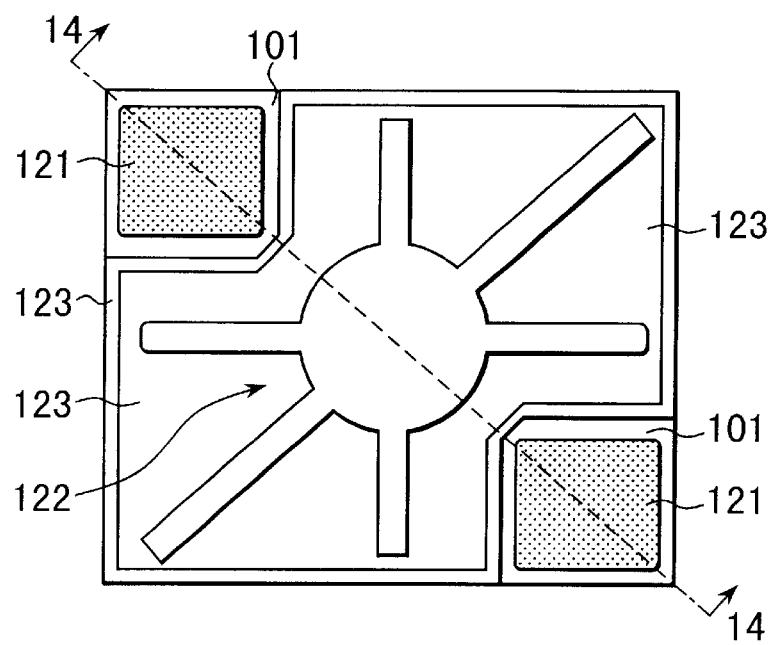
FIG. 13 is a plan view of the LED of FIG. 11.
Figure 14:
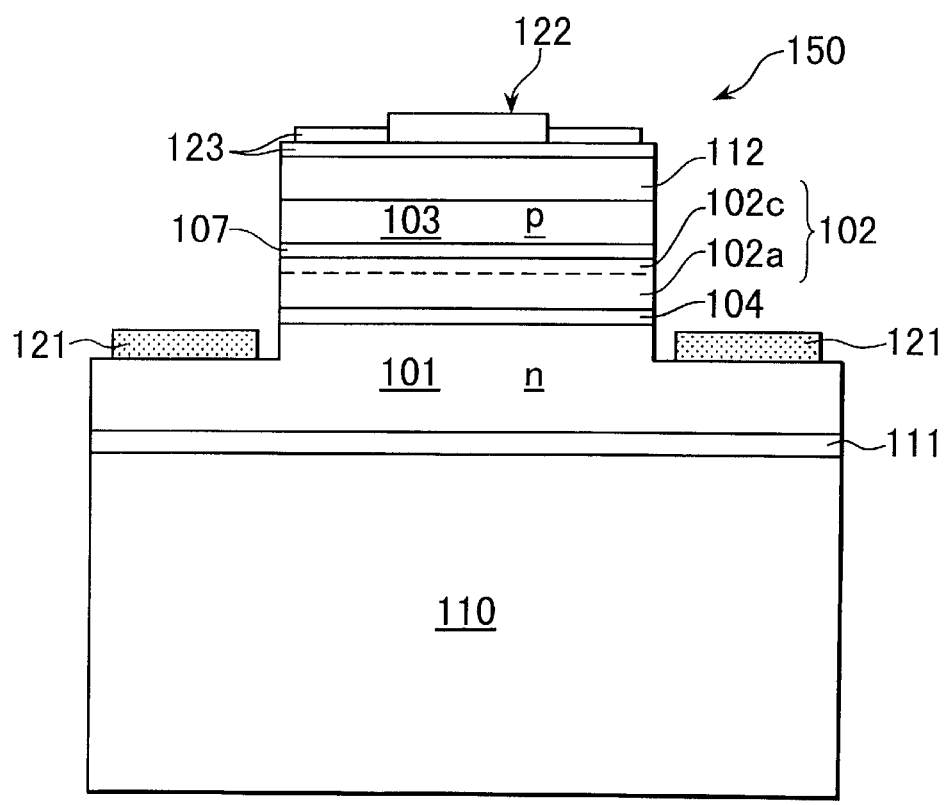
FIG. 14 is a structural cross-sectional view along line 14—14 of FIG. 13.

FIG. 13 is a plan view of the LED and FIG. 14 is a cross-sectional view along line 14—14 of FIG. 13. Prescribed portions of the layered structure 100 were etched away to expose the n-type layer 101, and aluminum n-type pad electrodes 121 were formed on the exposed portions. The top of the now mesa-shaped p-type top surface layer 112 was then covered with a 20-nm-thick, two-layer transparent electrode 123, and the metal oxide layer constituting the upper layer of the electrode 123 was selectively removed and a p-type pad electrode 122 was formed on a gold, thin-film electrode constituting the lower layer of the electrode 123.

LED 150 thus formed was operated to emit light by applying a DC voltage across n-type and p-type pad electrodes 121 and 122. Blue light emission was obtained at an application voltage of 0.4 V, with the intensity of the blue light emission rising as the forward voltage was increased. Using an integrating sphere, the emission output was measured and found to be 16.2 $\mu$W at a forward current of 20 mA. An LED with a light-emitting section of a conventional rectangular potential well structure having a $Ga_{0.85}In_{0.15}N$ well layer with a thickness of 7.5 nm, the same as that of the inventive LED, was found to have an emission output of 11.2 $\mu$W, 70% lower than that of the inventive LED.

The emission spectrum was measured using a spectrometer attached to a photoluminescence measurement apparatus. The LED 150 of the present invention was found to have an emission spectrum comprised principally of light of wavelength 452 nm with a full width at half maximum of 5 nm. The LED with the conventional potential structure had a full width at half maximum of 15 nm. Thus, in terms of the full width at half maximum value, the LED of the invention showed a major improvement, enabling light emission with even better monochromaticity.

EXAMPLE 2

In Example 2, an LED was fabricated having an intermediate layer with a fixed (single) composition, and a light-emitting layer with a multi-phase structure.

Figure 15:
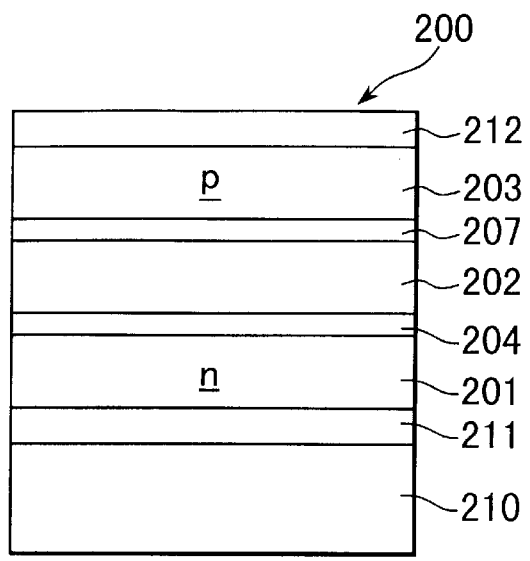
FIG. 15 is a cross-sectional view of the LED according to the second embodiment.

FIG. 15 is a cross-sectional view of the layered structure according to this Example. Layered structure 200 was formed using a substrate 210 of (0001)(c surface)-sapphire ($\alpha$-$Al_2O_3$ single crystal). A GaN buffer layer 211 having a thickness d of 20 nm was grown on the substrate 210 at 450° C., and an n-type layer 201 of Si-doped GaN was grown on the buffer layer 211 at 1050° C. The n-type layer 201 was 3 $\mu$m thick and had a carrier concentration of approximately $2\times10^{18}\text{cm}^{-3}$.

On the n-type layer 201, a normal pressure MOCVD method was used to grow an n-type intermediate layer 204 of Si-doped $Ga_{0.97}In_{0.03}N$ in which the indium composition ratio was 3% (0.03). The intermediate layer 204 was 0.2 μm thick and had a carrier concentration of approximately $4\times10^{18}cm^{-3}$.

An undoped n-type light-emitting layer 202 was formed on the intermediate layer 204, the n-type light-emitting layer 202 having a multi-phase structure containing $Ga_{0.94}In_{0.06}N$ with an indium composition ratio of 6% as the matrix phase and, as the subsidiary phase, crystallites having a maximum of twice the indium composition ratio of the matrix phase. The thickness of the light-emitting layer 202 was approximately 6 nm.

Using the same procedure described with reference to Example 1, a thin layer 207, p-type layer 203 and top surface layer 212, in that order, were grown on the light-emitting layer 202 at 1050° C. All layers were grown using ammonia ($NH_3$) as the source material for a group-V element.

Light-emitting layer 202 growth conditions and collateral conditions pertaining to the thin layer 207, p-type layer 203 and top surface layer 212 were set as follows.
(1) Indium source for the light-emitting layer 202: Cyclopentadienyl indium (($C_5H_5In(I)$)) (see pp 360 to 364 of J. Crystal Growth, 107 (1991).
(2) Light-emitting layer 202 growth temperature: 890° C.
(3) V/III ratio of light-emitting layer 202: 8000.
(4) Rate of temperature elevation from the light-emitting layer 202 growth temperature of 890° C. to the temperature of 1050° C. at which layers 207, 203 and 212 were grown: Approximately 110° C./min.
(5) Total growth time from thin layer 207 to p-type layer 203: 5 minutes.
(6) Growth time for top surface layer 212 was 3 minutes, so total high-temperature ($\geq 950°$ C.) growth time was 8 minutes.
(7) Cooling rate from the temperature of 1050° C. at which layers 207, 203 and 212 were grown to 950° C.: 50° C./min.
(8) Cooling rate from 950° C. to 650° C.: 15° C./min. Cooling from 650° C. to room temperature was effected by blowing cooling air onto the outer wall of the MOCVD growth reactor.

In order to measure the donor concentration (carrier concentration) of the light-emitting layer 202, the above conditions were also used to separately form, on an n-type layer of GaN single crystal, an n-type light-emitting layer having $Ga_{0.94}In_{0.06}N$ as the matrix phase and a relatively large thickness of 0.6 μm. The donor concentration thereof was measured by the Hall effect method, and found to be approximately $2\times10^{18}cm^{-3}$. The sheet carrier concentration on the thin layer 207 side of the light-emitting layer 202 was approximately $6\times10^{11}cm^{-2}$.

At room temperature, the $Ga_{0.97}In_{0.03}N$ constituting the intermediate layer 204 and the $Ga_{0.94}In_{0.06}N$ constituting the matrix phase of the light-emitting layer 202 had a bandgap differential of approximately 0.10 eV. Since the conduction band offset ratio was not more than 1, the band offset on the conduction band side was not more than about 0.10 eV. Therefore, with a conduction band offset of approximately 0.10 eV, the junction between the intermediate layer 204 formed of $Ga_{0.97}In_{0.03}N$ and the light-emitting layer 202 having $Ga_{0.94}In_{0.06}N$ as the matrix phase is substantially a homojunction.

A light-emitting diode (LED) was fabricated using the layered structure 200 as the parent material.

Figure 16:
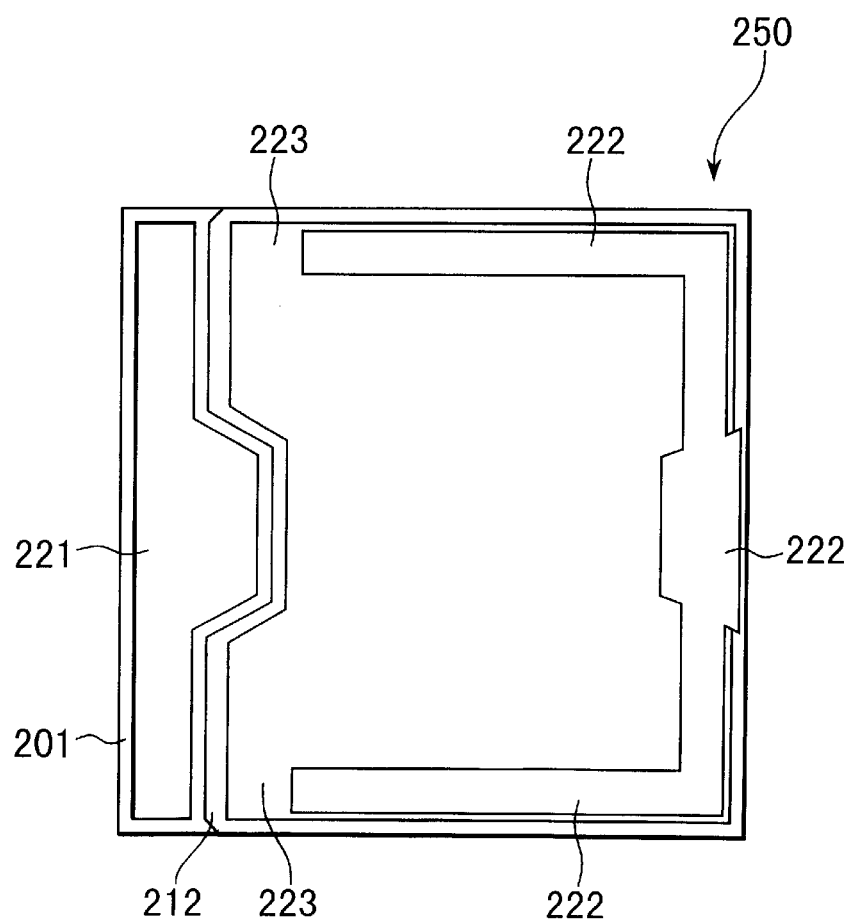
FIG. 16 is a plan view of the LED of FIG. 15.

FIG. 16 is a plan view of the LED. An n-type pad electrode 221 of aluminum was formed on the n-type layer 201, and a p-type pad electrode 222 formed of layers of Au—Be alloy and Au was formed on the top surface layer 212, thereby forming LED 250. A 200-nm-thick transparent electrode 223 containing a transition metal oxide was given to the p-type pad electrode 222.

The emission output of the LED 250 was 16.6 μW. The center wavelength of the emission spectrum was 435 nm, at which the full width at half maximum was 11 nm. Thus, a major improvement in both output and monochromaticity was observed.

Representative electrical characteristics were excellent: a forward voltage of 3.8 V at a forward current of 20 mA, and at a reverse current of 10 μA, a reverse voltage of over 15 V.

The results obtained with the Examples 1 and 2 show that a group-III nitride LED having excellent emission characteristics can be provided with the configuration of the present invention in which an electron localized region R is provided in a region in the vicinity of one junction interface, and an intermediate layer is used to promote accumulation and localization of carriers in said region, without using the conventional configuration in which the light-emitting section is provided with a quantum well structure having a rectangular potential well configuration.

While in the above Examples it was LEDs that were formed from layered structures, other light-emitting devices may instead be formed, such as laser diodes.

The present invention comprising the configurations described in the foregoing has the effects described below.

In the device of this invention, an electron localized region is provided in a part of the n-type light-emitting layer that is in the vicinity of the junction interface with a thin layer, so that when, under a forward bias, holes of the p-type semiconductor layer diffuse via the thin layer into the light-emitting layer side of the junction interface, the holes flow down into the adjoining electron localized region and recombine with electrons in the electron localized region. Recombination therefore takes place smoothly and a high light-emission intensity can be obtained. The smoothness of the recombination also enhances the high-speed emission on/off responsive characteristics.

In the case of a conventional light-emitting device having a rectangular potential well of a certain width, the control applied to the composition of the junction interface has the effect of giving the light-emitting layer a multi-phase structure and gradual band changes. The band offset is therefore not constant, and the susceptibility the light-emitting layer has to sublimation can also give rise to changes in the layer thickness. Such factors give rise to emission wavelength fluctuation and instability. The present invention does not rely on an emission mechanism based on a rectangular band configuration. Instead, in this invention the junction interface is provided with a non-rectangular potential, which enables the emission wavelength to be stabilized, even if there are slight variations in the thickness of the light-emitting layer. The result is that the device exhibits very good monochromaticity.

Also, the provision between the n-type light-emitting layer and the p-type semiconductor of a thin layer having a carrier concentration of up to $5\times10^{17}cm^{-3}$ and providing the electron localized region adjacent to the thin layer enables the conduction band offset on the thin layer side of the n-type light-emitting layer to be increased, thereby making it possible to deepen the conduction band bend at the electron localized region in the n-type light-emitting layer. Thus, electrons can be confined more securely in the electron localized region for more efficient recombination with the holes, resulting in better light emission characteristics.

Moreover, by giving the n-type light-emitting layer a donor concentration of from not less than $5\times10^{17} cm^{-3}$ to not more than $1\times10^{19} cm^{-3}$, the number of electrons that normally exhibit three-dimensional behavior in the three-dimensional space of the n-type light-emitting layer (three-dimensional carriers) are limited, making it possible to maintain the number of electrons that flow into the electron localized region at an appropriate level.

Also, by ensuring that in the electron localized region the sheet carrier concentration of electrons exhibiting mainly two-dimensional behavior (two-dimensional carriers) is not less than $1\times10^{11} cm^{-2}$ and not more than $5\times10^{13} cm^{-2}$, the proportion of the electron localized region taken up by two-dimensional carriers can be optimized with respect to the three-dimensional carriers in the three-dimensional space of the light-emitting layer.

Since the donor concentration of the n-type light-emitting layer and the sheet carrier concentration of the region of the n-type light-emitting layer in the vicinity of the junction interface with the thin layer are thus prescribed, the quantity of electrons in the electron localized region can be maintained at an appropriate level, thereby optimizing the light emission characteristics.

Carriers are selectively accumulated at an appropriate concentration in the electron localized region formed in the light-emitting layer having an asymmetrical, non-rectangular quantum potential well configuration. This enables effective radiation recombination with good high-speed response characteristics to take place. Thus, the group-III nitride semiconductor light-emitting device formed using a layered structure that includes this light-emitting layer is capable of high intensity of light at short wavelengths ranging from blue light to green light, with excellent monochromaticity, and is able to exhibit high-speed on/off response to the applied voltages.

A region of the n-type light-emitting layer in the vicinity of the junction interface with the thin layer is provided with a low carrier concentration layer, and the electron localized region is provided in the low carrier concentration layer. Therefore, the entry of electrons from the surrounding region of the light-emitting layer which have a high carrier concentration is facilitated, and the electron localized region is a region of high purity, meaning the concentration of impurities is low, so obstacles to the channeling of electrons caused by impurities do not readily arise, allowing high-speed, two-dimensional channeling of electrons to proceed smoothly.

Since the thickness of the low carrier concentration layer is from 2 nm to 20 nm, the movement of electrons that have accumulated in the electron localized region is restricted to a two-dimensional plane, controlling three-dimensional behavior and eliminating the wasted consumption of energy. Thus, since the electrons can actively move in the said plane, recombination of electrons and holes is more powerful and can take place at higher speed.

If the low carrier concentration layer is too thick, the conduction resistance and the forward current will be increased due to the low carrier concentration. Conversely, if the layer is too thin, it reduces the size of the region in which electrons can localize and the number of the electrons accumulated in the region. Therefore, the thickness of the low carrier concentration layer is defined in this invention as between 2 nm and 20 nm, which makes it possible to prevent the forward current increasing and the quantity of electrons in the electron localized region from decreasing to too low a level.

Also, the device of the invention includes a configuration in which an n-type intermediate layer is disposed between the n-type semiconductor layer and the n-type light-emitting layer in which the band offset on the conduction band side of the junction interface with the light-emitting layer is not more than 0.2 eV, so the band offset between the intermediate layer and the light-emitting layer is decreased to the extent that the junction can be regarded as substantially a homojunction. The junction configuration therefore serves to inhibit carriers (electrons) supplied from the n-type semiconductor layer side from staying in the junction interface on the n-type layer side of the light-emitting layer, ensuring that the carriers (electrons) are smoothly guided into the light-emitting layer, so it also has the effect of selectively and efficiently causing the carriers to be accumulated in the electron localized region provided in the light-emitting layer in the region of the junction interface with the p-type semiconductor layer. Thus, these carriers can efficiently undergo radiation recombination with the holes of the p-type semiconductor layer, increasing the light emission intensity with excellent monochromaticity.

The device of the invention also includes one having a configuration in which the n-type light-emitting layer is formed as a multi-phase structure comprised of matrix and subsidiary phases having different indium concentrations, and an n-type intermediate layer in which the conduction band discontinuity with respect to the matrix phase in the Junction interface with the n-type light-emitting layer is not more than 0.2 eV is interposed between the n-type semiconductor layer and the n-type light-emitting layer. The composition of this intermediate layer is directed at the matrix phase which predominates in the junction interface, and enables what is substantially a homojunction between the intermediate layer and the light-emitting layer to be securely and stably realized, even when the light-emitting layer has a multi-phase structure.

The intermediate layer can also be formed of an indium-containing group-III nitride semiconductor in which the bandgap gradually increases going from the n-type light-emitting layer toward the n-type semiconductor layer. This enables the conduction band offset between the light-emitting layer and the n-type semiconductor layer to be incrementally increased going from the n-type light-emitting layer toward the n-type semiconductor layer. This facilitates the smooth flow of the carriers (electrons) supplied from the n-type semiconductor layer side to the light-emitting layer for radiation recombination.

Increasing the conduction band offset from the n-type light-emitting layer to the n-type semiconductor layer also contributes to changing the valence band offset. This has the advantage of suppressing exudation of holes from the n-type light-emitting layer to the n-type semiconductor layer.

What is claimed is:

1. A group-III nitride semiconductor light-emitting device comprising:

an n-type semiconductor layer formed of a group-III nitride semiconductor;

a p-type semiconductor layer formed of a group-III nitride semiconductor;

an n-type light-emitting layer formed of an indium-containing group-III nitride semiconductor and disposed between the n-type semiconductor layer and the p-type semiconductor layer, the n-type light-emitting layer having a donor concentration of from not less than $5\times10^{17} cm^{-3}$ to not more than $1\times10^{19} cm^{-3}$; and a thin layer of a group-III nitride semiconductor having a lower electron affinity than an electron affinity of the indium-containing group-III nitride semiconductor of the n-type light-emitting layer, the thin layer having a thickness of from not less than 3 nm to not more than 30 nm and a carrier concentration of not more than $5 \times 10^{17}$ cm$^{-3}$ and being disposed between the n-type light-emitting layer and the p-type semiconductor layer, wherein a region of the n-type light-emitting layer in a vicinity of a junction interface with the thin layer comprises a low carrier concentration layer having a carrier concentration that is less than a carrier concentration in a region of the n-type light-emitting layer in a vicinity of a junction interface with the n-type semiconductor layer, wherein the carrier concentration of the low carrier concentration layer is not more than $5 \times 10^{17}$ cm$^{-3}$ and a thickness of the low carrier concentration layer is from not less than 2 nm to not more than 20 nm, wherein the low carrier concentration layer comprises an electron localized region, wherein the electron localized region is provided in the region of the n-type light-emitting layer in the vicinity of the junction interface with the thin layer, and in the electron localized region electrons are selectively, two-dimensionally accumulated and localized, and wherein the electron localized region having a sheet-shape formed along the junction interface, the electron localized region having a sheet carrier concentration of from not less than $1 \times 10^{11}$ cm$^{-2}$ not more than $5 \times 10^{13}$ cm$^{-2}$.

2. A light-emitting device according to claim 1, wherein the n-type light-emitting layer is formed as a multi-phase structure comprised of matrix and subsidiary phases having different indium concentrations, and an n-type intermediate layer in which a conduction band discontinuity with respect to the matrix phase at a junction interface between the n-type intermediate layer and the n-type light-emitting layer is not more than 0.2 eV is interposed between the n-type semiconductor layer and the n-type light-emitting layer.

3. A light-emitting device according to claim 2, wherein the intermediate layer is comprised of a group-III nitride semiconductor which, at the junction interface between the n-type intermediate layer and the n-type light-emitting layer, has a composition identical to or close to said matrix phase.

4. A light-emitting device according to claim 2, wherein the intermediate layer is comprised of an indium-containing group-III nitride semiconductor having a bandgap that gradually increases going toward the n-type semiconductor layer.

5. A light-emitting device according to claim 3, wherein the intermediate layer is comprised of an indium-containing group-III nitride semiconductor having a bandgap that gradually increases going toward the n-type semiconductor layer.

* * * * *